United States Patent [19]
Takemae et al.

[11] Patent Number: 6,154,405
[45] Date of Patent: *Nov. 28, 2000

[54] SEMICONDUCTOR MEMORY DEVICE HAVING A DUMMY CELL RESETTING THE BIT LINES TO A RESET POTENTIAL THAT IS BASED ON DATA READ IN A PREVIOUS READ DATA

[75] Inventors: Yoshihiro Takemae; Masao Taguchi; Masao Nakano; Hirohiko Mochizuki; Hiroyoshi Tomita; Yasurou Matsuzaki; Tadao Aikawa, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/924,315

[22] Filed: Sep. 5, 1997

[30] Foreign Application Priority Data

Dec. 25, 1996 [JP] Japan .................................. 8-346032
May 30, 1997 [JP] Japan .................................. 9-142310

[51] Int. Cl.$^7$ ................................................ G11C 7/02
[52] U.S. Cl. ................................ 365/210; 365/189.04
[58] Field of Search ........................... 365/149, 189.04, 365/183, 190, 102, 239, 210, 185.2, 203, 202

[56] References Cited

U.S. PATENT DOCUMENTS

| | | | |
|---|---|---|---|
| 4,558,434 | 12/1985 | Baba et al. | 365/189 |
| 4,606,010 | 8/1986 | Saito | 365/149 |
| 4,616,344 | 10/1986 | Noguchi et al. | 365/203 |
| 4,780,852 | 10/1988 | Kajigaya et al. | 365/203 |
| 5,235,547 | 8/1993 | Kobayashi | 365/190 |
| 5,406,516 | 4/1995 | Ihara et al. | 365/189.01 |
| 5,487,044 | 1/1996 | Kawaguchi et al. | 365/203 |
| 5,559,737 | 9/1996 | Tanaka et al. | 365/185.25 |

FOREIGN PATENT DOCUMENTS

93/07565  4/1993  WIPO .

*Primary Examiner*—David Nelms
*Assistant Examiner*—Thong Le
*Attorney, Agent, or Firm*—Arent Fox Kinter Plotkin & Kahn, PLLC

[57] ABSTRACT

A semiconductor memory device includes memory cells, word lines connected to the memory cells, bit lines connected to the memory cells, and a first circuit which resets the bit lines to a reset potential which is based on data read in a previous read cycle.

24 Claims, 28 Drawing Sheets

PSA= H(VCC), NSA= L(VSS) => SENSE AMP ON
PSA= L(VSS), NSA= H(VCC) => SENSE AMP OFF

SEMICONDUCTOR MEMORY DEVICE HAVING A DUMMY CELL RESETTING THE BIT LINES TO A RESET POTENTIAL THAT IS BASED ON DATA READ IN A PREVIOUS READ DATA

BACKGROUND OF THE INVENTION

1. Field of the Invention

The present invention generally relates to semiconductor memory devices, and more particularly to a dynamic random access memory (DRAM) device. More specifically, the present invention is concerned with a read operation of such a DRAM device in which data is read from a memory cell of the DRAM device.

2. Description of the Related Art

FIG. 1 is a circuit diagram of a part of a conventional DRAM device. The circuit configuration shown in FIG. 1 relates to a pair of bit lines BL and /BL. The DRAM device shown in FIG. 1 includes a sense amplifier part 10 and two cell array parts 12 and 14 connected to the sense amplifier part 10. The sense amplifier part 10 is commonly connected to the two cell array parts 12 and 14. The cell array part 14 has the same circuit configuration as that of the cell array part 12, and thus the internal configuration of the cell array part 14 is omitted in FIG. 1 for the sake of simplicity.

The cell array part 12 includes a plurality of memory cells MC connected to the pair of bit lines BL and /BL. The cells MC are alternately connected to the bit lines BL and /BL in a folded-type bit line formation. Each of the memory cells MC consists of one capacitor and one transistor. The cell array part 12 also includes a transistor which receives a bit line reset signal BRST, which instructs the transistor to short-circuit the bit lines BL and /BL and precharge these bit lines to a voltage of VCC/2, where VCC is a high-potential-side power supply voltage.

The sense amplifier part 10 includes a flip-flop circuit 16, a data input/output circuit 18 and transfer gate circuits 20 and 22. The flip-flop circuit 16, which is made up of four transistors, sets the potential of one of the bit lines BL and /BL to one of control signals PSA and NSA and sets the potential of the other bit line to the other control signal. Each of the transfer gate circuits 20 and 22 includes two transistors respectively connected to the bit lines BL and /BL. The transfer gate circuits 20 and 22 operate in response to transfer control signals BT0 and BT1 so that one of the cell array parts 12 and 14 is connected to the sense amplifier part 10. The data input/output circuit 18 includes two transistors, and connects the bit lines BL and /BL to data bus lines DB and /DB (two bus lines of a data bus) in response to a column select signal CL.

FIG. 2 is a waveform diagram of a read operation of the DRAM device shown in FIG. 1. It will now be assumed that the DRAM device operates in synchronism with a clock signal CLK having one cycle of 10 ns. One cycle of the read operation is carried out in accordance with a row address command ROW, a column address command COL, and a bit line precharge command PRE, and is equal to 90 ns.

The row address command ROW is externally applied to the DRAM device in a state in which the bit lines BL and /BL are at the precharge (reset) level equal to VCC/2. The row address is decoded by a row address decoder, which is not shown in FIG. 1. Then, the decoder drives a corresponding word line. It will now be assumed that a word line WL shown in FIG. 1 is driven. The word line WL rises toward the high-potential-side power supply voltage VCC from a low-potential-side power supply voltage VSS. The potential of one of the bit lines which is located on the selected side is changed in accordance with data (binary data "0" or "1") stored in the cell MC connected to the selected word line WL. In FIG. 2, the bit line BL is located on the selected side (that is, the cell MC connected to the selected word line WL is connected to the bit line BL). Further, the selected cell MC stores data "0". In this case, the potential of the bit line BL starts to decrease from VCC/2. At this time, the potential of the not-selected-side bit line /BL is maintained at VCC/2.

The sense amplifier part 10 senses the relative potential change between the bit lines BL and /BL. Hence, as shown in FIG. 2, the potential of the bit line BL is drawn to VSS and the potential of the bit line /BL is drawn to VCC.

After the sense amplifier part 10 starts the sense operation, the column select signal CL is turned ON (activated) in response to the column address command COL. Then, the potentials of the bit lines BL and /BL settled by the sense amplifier part 10 are respectively output to the data bus lines DB and /DB via the data input/output circuit 18. This output operation is indicated as "DATA" in FIG. 2. Simultaneously, the bit line precharge command PRE is externally received, and the bit line reset signal BRST is activated. Hence, the bit lines BL and /BL are precharged (reset) to VCC/2. Hence, the DRAM device is ready for the next read operation. In the above-mentioned manner, the one cycle of the read operation is carried out.

However, the above prior art DRAM device has the following disadvantage.

As described above, the read operation needs the precharge operation in which the bit lines BL and /BL are precharged to VCC/2. More particularly, one cycle of the read operation includes the time necessary to precharge the bit lines BL and /BL to VCC/2. This prevents speeding up of the read operation.

SUMMARY OF THE INVENTION

It is an object of the present invention to provide a semiconductor memory device in which the above disadvantage is eliminated.

A more specific object of the present invention is to provide a semiconductor device in which data can be read at a higher speed.

The above objects of the present invention are achieved by a semiconductor memory device comprising: memory cells; word lines connected to the memory cells; bit lines connected to the memory cells; and a first circuit which resets the bit lines to a reset potential which is based on data read in a previous read cycle. Hence, it is not necessary to provide a precharge cycle which precharges the bit lines to a given precharge level (VCC/2) before a read operation. Hence, the speed of the read operation of the memory device can be increased.

The semiconductor memory device may be configured so that: the bit lines includes a pair of bit lines; and the first circuit resets one of the pair of bit lines to the reset potential which is equal to a potential of the other one of the pair of bit lines which was set in the previous read cycle.

The semiconductor memory device may be configured so that the reset potential is equal to one of a high-potential-side power supply voltage and a low-potential-side power supply voltage. This is quite different from the conventional precharge level equal to VCC/2.

The semiconductor memory device may be configured so that: the first circuit comprises a dummy cell selectively connected to one of the pair of bit lines; and the dummy cell sets one of the pair of bit lines to a potential opposite to a potential of the other one of the pair of bit lines which was set so that data was read to the pair of bit lines from a selected one of the memory cells in the previous read cycle.

The semiconductor memory device may be configured so that one of the pair of bit lines is driven in each read cycle.

The semiconductor memory device may be configured so that a next read cycle is initiated before data read a selected one of the memory cells is output to an external device.

The semiconductor memory device may further comprise sense amplifiers connected to the bit lines, the sense amplifiers being reset based on the data read in the previous read cycle.

The semiconductor memory device may be configured so that: the sense amplifiers include first and second sense amplifiers which are respectively arranged on both sides of the bit lines; and when the first sense amplifiers located on one side of the bit lines perform sense operations, the second sense amplifiers located on the other side of the bit lines reset the first sense amplifiers after the first sense amplifiers complete the sense operations.

The semiconductor memory device may further comprise a second circuit which resets the sense amplifiers on the basis of the data read in the previous read cycle.

The semiconductor memory device may further comprise: first sense amplifiers connected to the bit lines; and second sense amplifiers connected to another bit lines, wherein the semiconductor memory device includes a second circuit which is provided in common to the first and second sense amplifiers and is located therebetween, the second circuit resetting the first and second sense amplifiers on the basis of the data read in the previous read cycle.

The semiconductor memory device may be configured so that the second circuit resets the first and second sense amplifiers to different reset states.

The semiconductor memory device may further comprise: data input/output circuits which are provided between the bit lines and data buses and are controlled by column select signals; and gate circuits which are provided between the sense amplifiers and the data buses and selectively connect the bit lines to the data buses on the basis of states of sense amplifiers connected to the bit lines.

The semiconductor memory device may be configured so that each of the data input/output circuits is a direct sense circuit which includes a transistor which indirectly couples the corresponding bit lines to the data buses, the transistor connecting the data buses to a given potential on the basis of the state of the corresponding sense amplifier.

The semiconductor memory device may be configured so that the given potential is a reset potential of the data buses when the sense amplifiers are OFF.

There is also provided a semiconductor memory device comprising memory cells; word lines connected to the memory cells; pairs of bit lines connected to the memory cells; sense amplifiers connected to the pairs of bit lines; pairs of data buses connecting the sense amplifiers to data input/output circuits; and a circuit which sets the pairs of data buses to a floating state, wherein, when data includes a bit to be masked and inhibited from being written into a corresponding one of the memory cells, the circuit sets a corresponding one of the pairs of data buses to the floating state. Hence, it is possible to write data having a plurality of bits into corresponding memory cells at one time in such a state that one or some bits of the data can be masked and inhibited from being written into a corresponding memory cell.

BRIEF DESCRIPTION OF THE DRAWINGS

Other objects, features and advantages of the present invention will become more apparent from the following detailed description when read in conjunction with the accompanying drawings in which.

DESCRIPTION OF THE PREFERRED EMBODIMENTS

A description will first be given of the principle of the present invention with reference to FIG. 3, which is a waveform diagram of a read operation according to the present invention.

Figure 1:
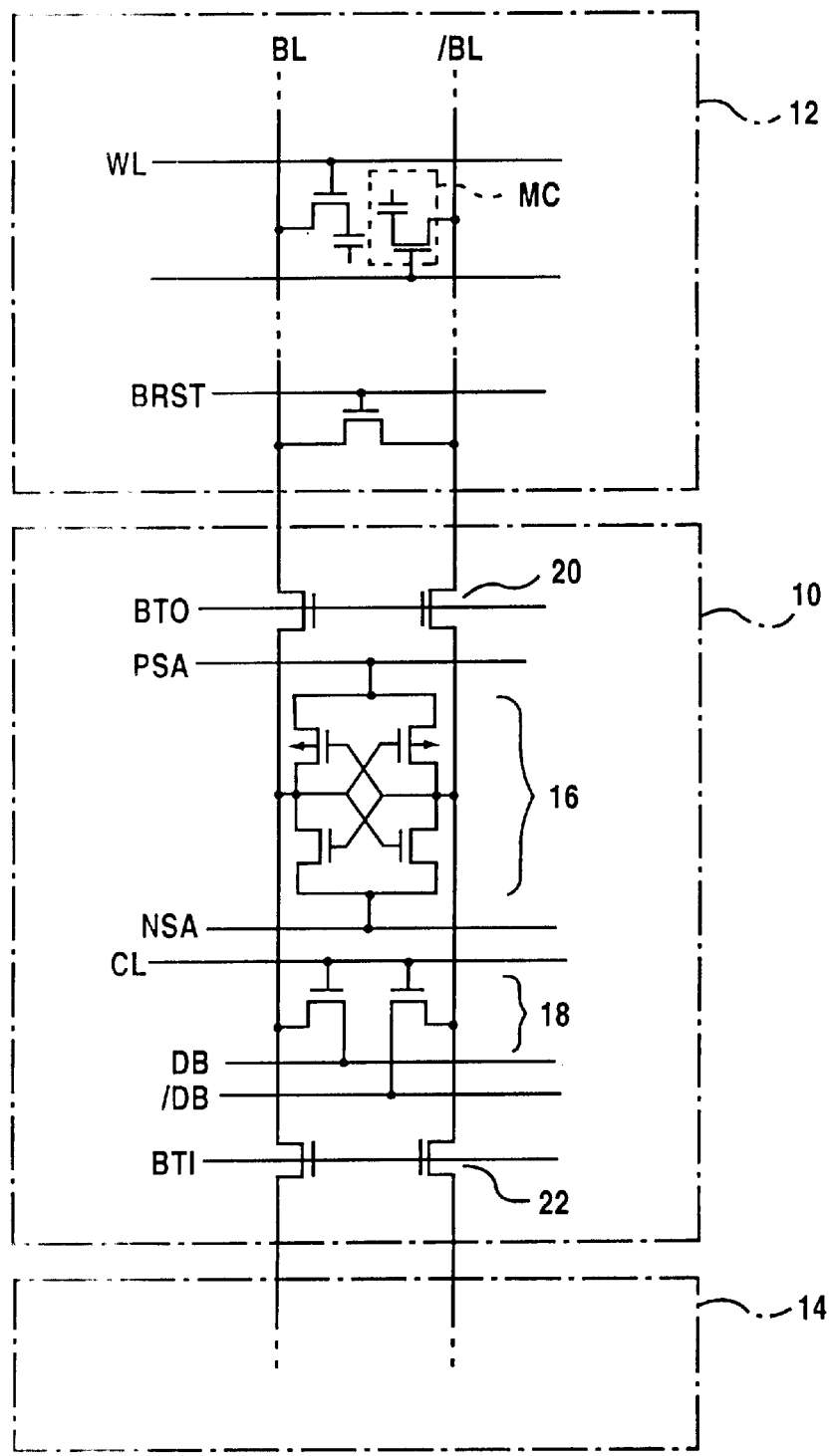
FIG. 1 is a circuit diagram of a part of a conventional DRAM device.
Figure 2:
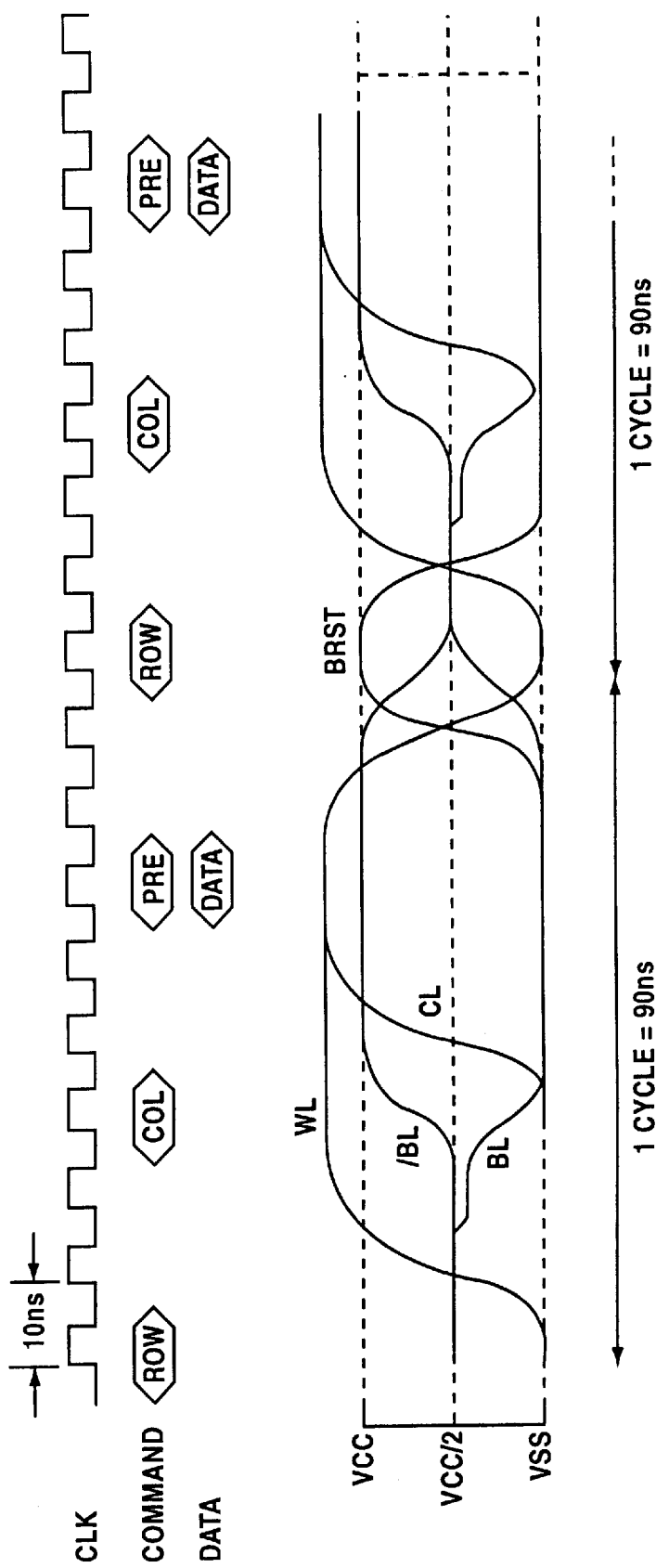
FIG. 2 is a waveform diagram of a read operation of the DRAM device shown in FIG. 1.
Figure 3:
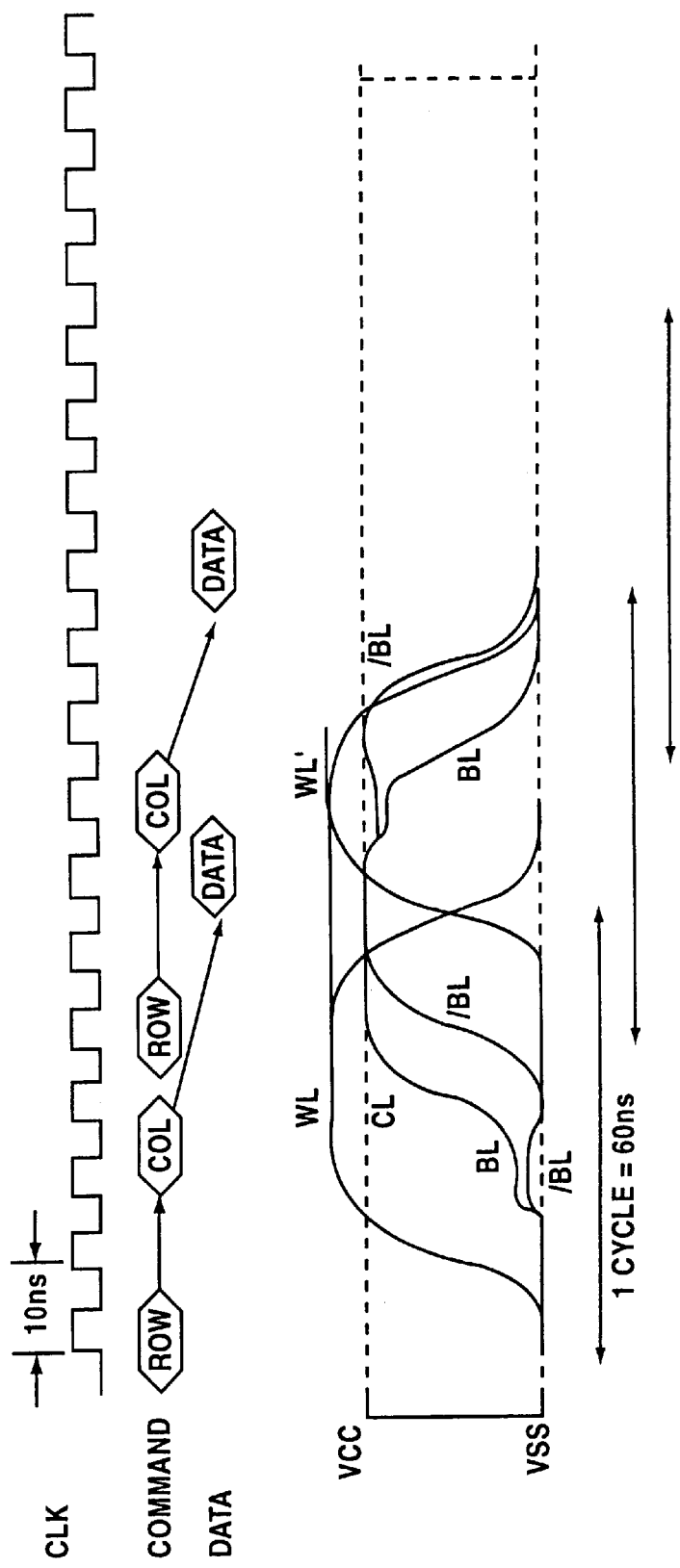
FIG. 3 is a waveform diagram showing the principle of the present invention.

It will be seen from comparison between FIGS. 2 and 3 that the present invention does not have the bit line precharge command PRE. In the other words, the present invention does not precharge the pair of bit lines to VCC/2 as in the conventional formation, and does not require the bit line precharge command PRE. Hence, the column address command COL is received and the next read cycle can be immediately carried out. After the next read cycle is started, data which was read in the previous read cycle is output to data bus lines (which correspond to the data bus lines DB and /DB). This means that the access cycle for the read operation (which corresponds to the time between the commands ROW and COL) is shorter than one cycle of the read operation and that the next read operation is carried out before the previous read operation is completed.

As another aspect of the present invention, a new bit line reset method is employed instead of the conventional precharge operation in which the bit lines BL and /BL are precharged to VCC/2. According to the new bit line reset method, the potential of the bit line handled as the read side (selected side) in the previous read cycle is defined as a reset state (reset potential) in the next read cycle, and the potential of the other bit line is caused to be equal to the reset potential. In short, the pair of bit lines is reset so that the potentials of these bit lines are caused to be equal to the reset potential which is the potential of the bit line located on the read side (selected side) in the previously read cycle. In other words, the reset potential for the next read cycle depends on data read from the cell in the previous read cycle.

Referring to FIG. 3, the read operation is carried out as follows. The potential of the word line WL rises in response to the row address command ROW. In the example shown in FIG. 3, the bit lines BL and /BL are reset at VSS. This means that data "0" is read to the bit line located on the selected side in the previous read cycle. When the potential of the word line WL rises, the potentials of the bit lines BL and /BL are changed, as shown in FIG. 3. The bit line BL is located on the selected side, and the bit line /BL is located on the not-selected side. Since the cell connected to the selected-side bit line BL stores data "1", the potential of the bit line BL rises toward VCC. At the commencement of the rising of the potential of the bit line BL, the potential of the not-selected-side bit line /BL rises to a level which is slightly higher than VSS but is lower than the potential of the bit line BL. This is due to the function of a dummy cell, which will be described later.

The potential difference between the bit lines BL and /BL occurs in the above-mentioned manner. Hence, data can be read by sensing the above potential difference by a sense amplifier. The potential of the not-selected-side bit line /BL is returned to VSS by the sense operation of the sense amplifier, as shown in FIG. 3. It should be noted that the potential of the not-selected-side bit line /BL is not necessarily required to be returned to VSS, but can be equal to any level lower than the potential of the bit line BL.

After the potential difference between the bit lines BL and /BL is sensed, the potential of the not-selected-side bit line /BL is caused to be equal to the potential of the selected-side bit line BL. In the example shown in FIG. 3, the potential of the bit line /BL is increased to VCC. When the potentials of both the bit lines BL and /BL become equal to VCC, the reset operation on the bit lines BL and /BL is completed. Hence, the word line WL selected in the current read cycle is turned OFF (decreased to VSS), and a word line WL1 selected in response to the row address command ROW for the next read cycle is raised.

In the case shown in FIG. 3, the bit line BL is located on the selected side, and data "0" is read (sensed by the sense amplifier) from the selected memory cell. Hence, the potential of the bit line BL is decreased toward VSS. At the commencement of decreasing in the potential of the bit line BL, the potential of the not-selected-side bit line /BL is higher than that of the selected-side bit line BL due to the function of the dummy cell. The sense amplifier senses the above potential difference.

According to the above read operation of the present invention, it is possible to reduce one cycle of the read operation to 60 ns and thus speed up the read operation.

The inventors know prior art in which the pair of bit lines is reset to VCC in each read cycle. However, the present invention differs from the above prior art in that data read in the previous read cycle defines the reset potential of the bit lines for the next read cycle.

Figure 4:
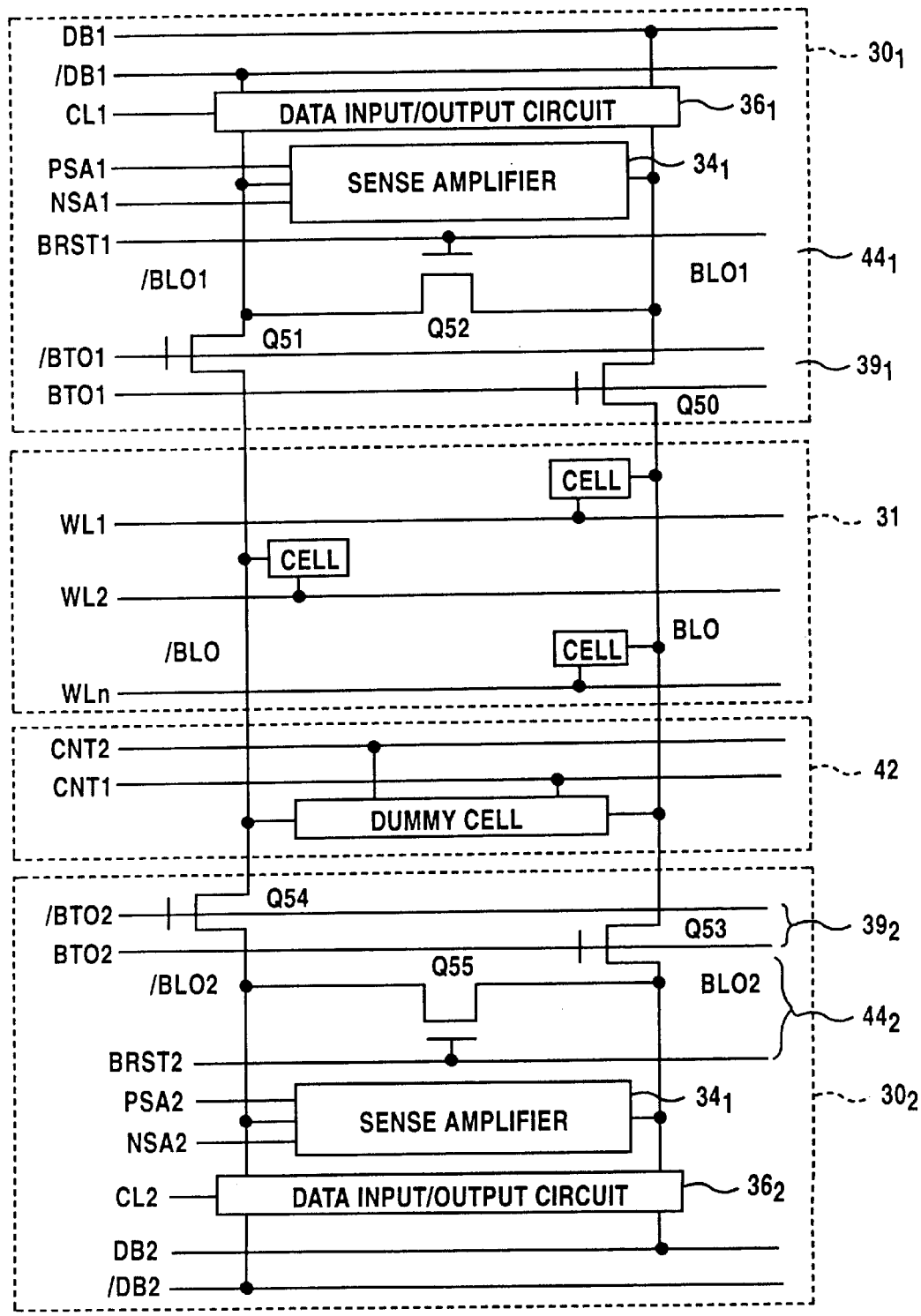
FIG. 4 is a circuit diagram of a semiconductor memory device according to a first embodiment of the present invention.

FIG. 4 is a circuit diagram of a part of a DRAM device according to a first embodiment of the present invention. The circuit configuration shown in FIG. 4 relates to a pair of bit lines BL0 and /BL0. The DRAM device includes a plurality of the same circuit configurations as shown in FIG. 4 for the respective bit lines. There are provided, for the pair of bit lines BL0 and /BL0, a cell array part 31, two sense amplifier parts $30_1$ and $30_2$, and a dummy cell part 42.

Figure 5:
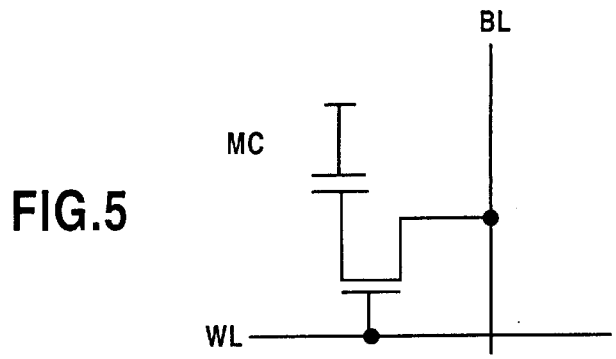
FIG. 5 is a circuit diagram of a memory cell.

The cell array part 31 includes a plurality of cells alternately connected to the bit lines BL0 and /BL0 in the folded bit line formation. Each cell MC consists of one capacitor and one transistor, as shown in FIG. 5. In FIG. 4, the gates of the transistors of the cells MC are connected to corresponding word lines WL1, WL2, . . . , WLn.

The sense amplifier part $30_1$ is provided on one side of the pair of bit lines BL0 and /BL0 in the cell array part 31. The sense amplifier part $30_2$ is provided on the other side of the pair of bit lines BL0 and /BL0 via the dummy cell part 42. The sense amplifier part $30_1$ includes a sense amplifier $34_1$, a data input/output circuit $36_1$, a transfer gate circuit $39_1$, and a bit line reset circuit $44_1$. These circuit components are connected to a pair of internal bit lines BL01 and /BL01 provided in the sense amplifier part $30_1$.

Figure 6:
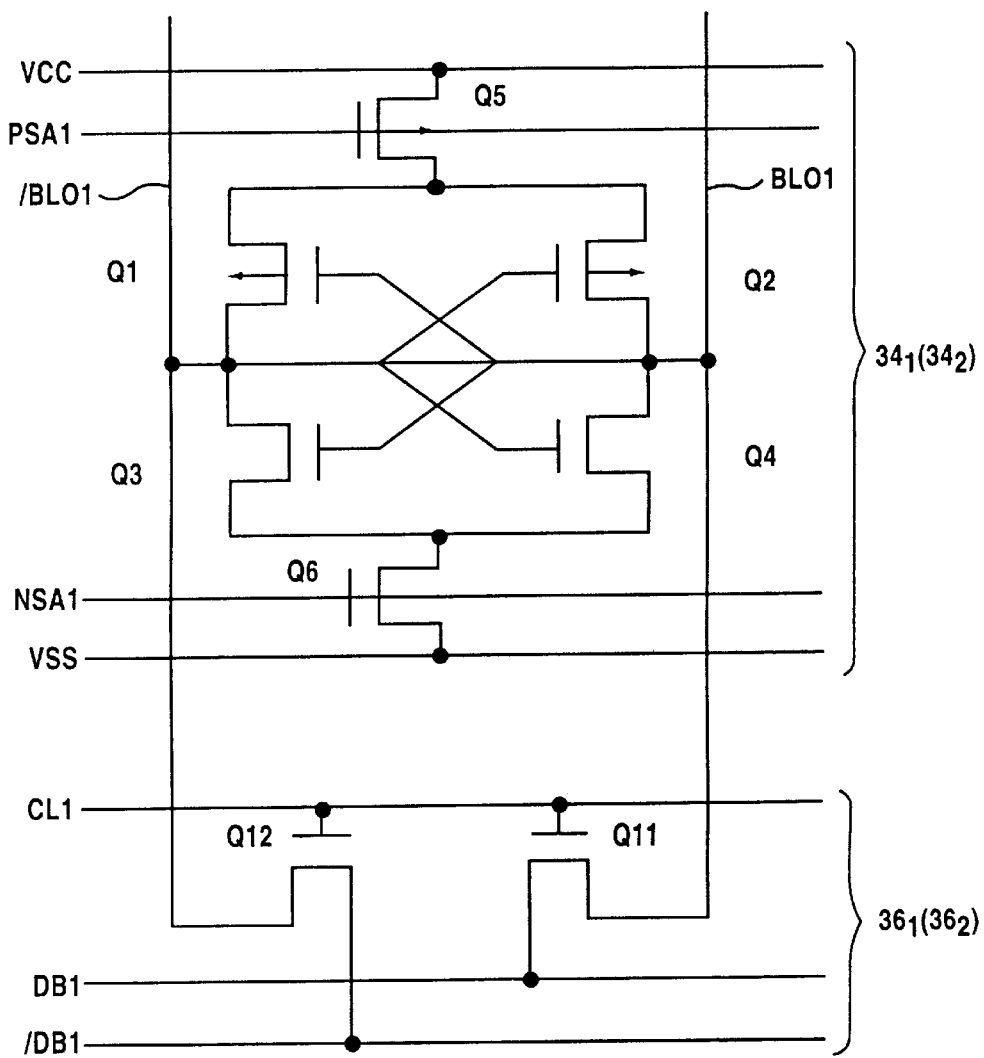
FIG. 6 is a circuit diagram of a sense amplifier.

FIG. 6 shows an example of the structures of the sense amplifier $34_1$ and the data input/output circuit $36_1$. The sense amplifier $34_1$ includes a flip-flop, which consists of transistors Q1–Q4, and transistors Q5 and Q6. In FIG. 6, transistor symbols with arrows denote P-channel field-effect transistors (such as MOS transistors), and transistor symbols without arrows denote N-channel field-effect transistors. The transistor Q5 selectively connects the power supply voltage VCC to the flip-flop in accordance with a control signal PSA1. The transistor Q6 selectively connects the power supply voltage VSS to the flip-flop in accordance with a control signal NSA1. The data input/output circuit $36_1$ includes transistors Q11 and Q12, and respectively connect the internal bit lines BL01 and /BL01 to data bus lines DB1 and /DB1 in accordance with a column select signal CL1. The sense amplifier $34_1$ is turned ON when the control signal PSA1 is low (VSS) and the control signal NSA1 is high (VCC).

Turning now to FIG. 4, the transfer gate circuit $39_1$ includes transistors Q50 and Q51, and selectively connects the internal bit lines BL01 and /BL01 to the bit lines BL0 and /BL0 of the cell array part 31 in accordance with transfer control signals BT01 and /BT01.

The bit line reset circuit $44_1$ includes a transistor Q52, and short-circuits the internal bit lines BL01 and /BL01 when a bit line reset signal BRST1 is activated. Hence, the internal bit lines BL01 and /BL01 are reset.

The sense amplifier part $30_2$ has the same configuration as that of the sense amplifier part $30_1$. The sense amplifier part $30_2$ includes a sense amplifier $34_2$ a data input/output circuit $36_2$, a transfer gate circuit $39_2$ and a bit line reset circuit $44_2$. These circuit components are connected to a pair of internal bit lines BL02 and /BL02 in the sense amplifier part $30_2$. The sense amplifier $34_2$ and the data input/output circuit $36_2$ are the same as shown in FIG. 6. When the suffixes added to the reference numbers shown in FIG. 6 are changed to "2", the configuration shown in FIG. 2 becomes relative to the sense amplifier part $30_2$ (BL01→BL02, /BL01→/BL02, DB1→DB2, /DB1→/DB2, CL1→CL2, /CL1→/CL2, PSAL→PSA2, NSA1→NSA2).

The transfer gate circuit $39_2$ includes transistors Q53 and Q54, and selectively connects the internal bit lines BL02 and /BL02 to the bit lines BL0 and /BL0 of the cell array part 31 in accordance with transfer control signals BT02 and /BT02.

The bit line reset circuit $44_2$ includes a transistor Q55, and short-circuits the internal bit lines BL02 and /BL02 when a bit line reset signal BRST2 is activated. Hence, the internal bit lines BL02 and /BL02 are reset.

Figure 7:
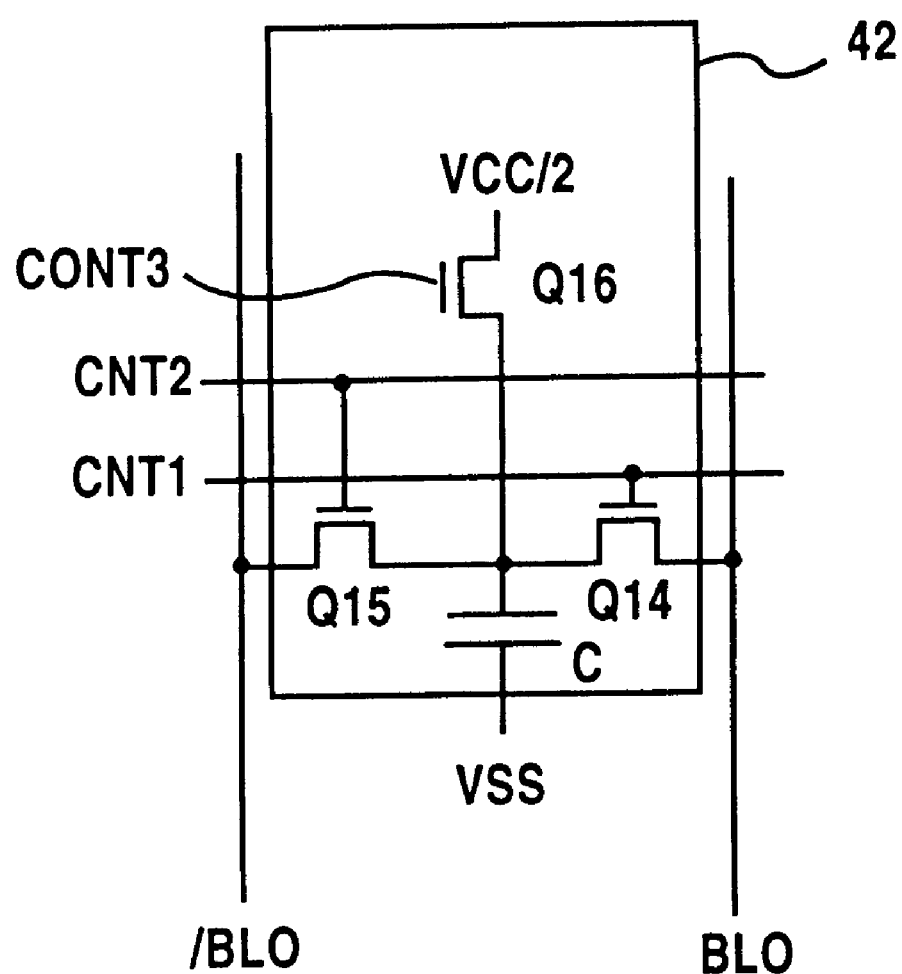
FIG. 7 is a circuit diagram of a dummy cell shown in FIG. 4.

FIG. 7 is a circuit diagram of the dummy cell part 42, which is made up of two dummy cell transistors Q14 and Q15, a capacitor C, and a transistor Q16 which selectively supplies VCC/2 to the capacitor C. The transistor Q14 is provided between the bit line BL0 and the capacitor C, and is turned ON and OFF by a dummy cell control signal CNT1. The transistor Q15 is provided between the bit line /BL0 and the capacitor C, and is turned ON and OFF by a dummy cell control signal CNT2. The transistor Q16 is connected to VCC/2, and selectively charges up the capacitor C.

When data is read from a cell connected to the bit line BL0 of the sense amplifier part 31, the dummy cell control signal CNT2 is supplied so that the transistor Q15 of the dummy cell part 42 connected to the other bit line /BL0 is turned ON. When data is read from a cell connected to the bit line /BL0 of the sense amplifier part 31, the dummy cell control signal CNT1 is supplied so that the transistor Q14 of the dummy cell part 42 connected to the bit line BL0 is turned ON.

Figure 8:
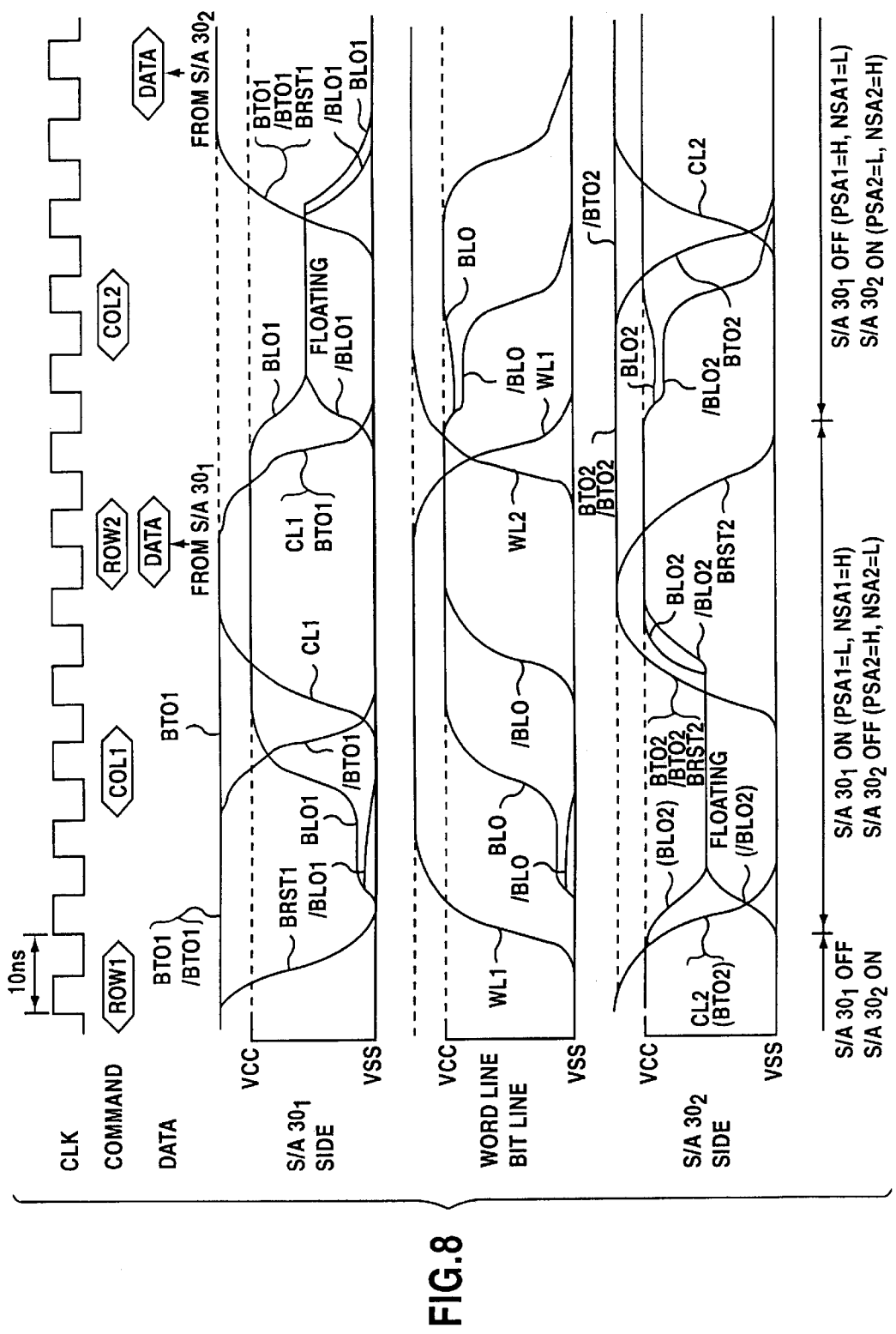
FIG. 8 is a waveform diagram of an operation of the circuit shown in FIG. 4.

A description will now be given, with reference to FIG. 8, of an operation of the DRAM device shown in FIG. 4. As will be described later, the sense amplifier parts $30_1$ and $30_2$ are alternately operated in the read operation. That is, the pairs of data bus lines DB1 and /DB1 and DB2 and /DB2 alternately output read data. While the sense amplifier $30_1$ is reading and outputting data from the sense amplifier part $30_1$, the sense amplifier part $30_2$ resets the pair of bit lines.

The sense amplifier part $30_1$ is OFF and the sense amplifier part $30_2$ is ON immediately before a row address command ROW1 is supplied. When the row address command ROW1 is supplied, the sense amplifier part $30_1$ is turned ON. The ON/OFF control of the sense amplifier parts $30_1$ and $30_2$ (more particularly, sense amplifiers $34_1$ and $34_2$) is realized by the control signals PSA1, NSA1, PSA2 and NSA2. The internal bit lines BL01 and /BL01 of the sense amplifier part $30_1$ are in the reset state (equal to VSS in the example shown in FIG. 8), and the transistors Q51 and Q52 are ON. The sense amplifier part $30_2$ is ON and is reading data. In the example shown in FIG. 8, the transistor Q53 on the selected side (assuming that BL0 is the selected-side transistor) is ON, and the transistors Q54 and Q55 are OFF.

When the row address command ROW1 is externally supplied to the DRAM device, the sense amplifiers $30_1$ and $30_2$ are turned ON and OFF, respectively, by the control signals PSA1, NSA1, PSA2 and NSA2. The row address command ROW1 is decoded by a decoder (which is not shown in FIG. 4), and the word line WL1 is selected in the example shown in FIG. 8. Hence, the potential of the word line WL1 is increased toward VCC. The bit line reset signal BRST1 falls, and the transistor Q52 is turned OFF. Hence, the internal bit lines BL01 and /BL01 are released from the reset state, and the sense amplifier $34_1$ is ready to read data from the selected cell. The transistor Q53 of the sense amplifier $30_2$ is turned OFF because the transfer control signal BT02 becomes low. Hence, the sense amplifier $34_2$ is disconnected from the bit line BL02 in the cell array part 31.

When the potential of the word line WL1 becomes equal to a sufficient potential, a potential difference between the bit lines BL0 and /BL0 is produced. For example, if the cell connected to the selected word line WL1 stores data "1", the charge stored in the cell flows to the bit line BL0, so that the potential of the bit line BL0 is increased. The potential of the bit line /BL0 is changed by the dummy cell circuit 42. More particularly, the control signal CNT2 turns ON the transistor Q15 of the dummy cell circuit 42. Hence, a charge stored in the capacitor C of the dummy cell circuit 42 flows to the bit line /BL0 which is at VSS. The selected cell has a charge stored by VCC, while the capacitor C of the dummy cell circuit 42 has a charge stored by VCC/2. Hence, the increased potential of the bit line /BL0 is lower than the increased potential of the bit line BL0. Hence, the potential difference between the bit lines BL0 and /BL0 can be produced.

The above potential difference is transferred to the internal bit lines BL01 and /BL01, and the sense amplifier $34_1$ senses the potential difference. At this time, the transfer control signal /BT01 is caused to fall, and the transistor Q51 on the Lake- not-selected side is turned OFF. At the time when the sense amplifier $34_1$ senses data, the column address command COL1 is decoded, and the column control signal CL1 is increased. Hence, the sensed data can be output to the data bus lines DB1 and /DB1.

In the sense amplifier $30_2$, the transistor Q53 is turned OFF, and the bit line BL0 is disconnected from the internal bit line BL02. Hence, the internal bit lines BL02 and /BL02 are changed to the floating state. When the transistor Q51 of the sense amplifier $30_1$ is turned OFF, the reset operation on the bit lines BL0 and /BL0 in the cell array part 31 is started. That is, the transistors Q53, Q54 and Q55 are turned ON, and the not-selected-side bit line /BL0 is reset by the sense amplifier $34_1$ through a route including the sense amplifier $34_1$, the transistor Q50, the bit line BL0, the transistors Q53, Q55 and Q54, and the bit line /BL0. Hence, the bit line /BL0 is reset to the potential of the selected-side bit line BL0, that is, VCC in the example shown in FIG. 8. In the above manner, the potential of the not-selected-side bit line /BL0 is reset to the potential of the selected-side bit line BL0 after the read data is sensed, so that the next read cycle can be carried out.

In the next read cycle, the word line WL2 shown in FIG. 4 is selected by the row address command ROW2. Hence, the sense amplifier $30_1$ is turned OFF, and the sense amplifier $30_2$ is turned ON. The column select signal CL1 falls, and thus the data input/output circuit $36_1$ of the sense amplifier $30_1$ is turned OFF. The transfer control signal BT01 falls, and the transistor Q50 is turned OFF. Hence, the bit line BL0 which was located on the selected side in the previous read cycle is disconnected. In the example shown in FIG. 8, the bit line /BL0 located on the selected side stores data "0". In this case, the not-selected-side transistor Q14 is turned ON. The cell MC connected to the selected word line WL2 stores data "0", a charge flows to the cell from the bit line /BL0, and the potential of the bit line /BL0 is decreased. The transistor Q14 is turned ON, a charge flows to the capacitor C from the bit line BL0 which is at VCC. In this case, the capacitor C is charged up to VCC/2, and therefore the potential of the bit line BL0 is not decreased as much as the potential of the bit line /BL0.

The potential difference between the bit lines BL0 and /BL0 thus produced is transferred to the internal bit line BL02 and /BL02, and is then sensed by the sense amplifier $34_2$. After the read data is sensed, the transistor Q53 connected to the not-selected-side internal bit line BL02 is turned OFF. Further, the data input/output circuit $34_2$ is turned ON so that the sensed data can be output to the data bus lines DB2 and /DB2.

The internal bit lines BL01 and /BL01 in the sense amplifier part 30, are changed to the floating state. When the transistor Q53 of the sense amplifier part $30_2$ is turned OFF, the reset operation on the bit lines BL0 and /BL0 in the cell array part 31 is started. That is, the transistors Q50, Q51 and Q52 are turned ON, and the non-selected-side bit line BL0 is reset by the sense amplifier $34_2$ in a route having the sense amplifier $34_2$, the transistor Q54, the bit line /BL0, the transistors Q51, Q52 and Q50, and the bit line BL0. Hence, the potential of the non-selected-side bit line BL0 is reset to the potential of the selected-side bit line /BL0, that is, VSS in the example shown in FIG. 8. In the above manner, the potential of the not-selected-side bit line /BL0 is reset to the potential of the selected-side bit line BL0 after the read data is sensed, so that the next read cycle can be carried out.

The above read operation does not require the command PRE for precharging the bit lines, and the command ROW for the next read cycle can be placed immediately after the command COL for the previous read cycle. Hence, the read operation can be carried out at a higher speed.

Figure 9:
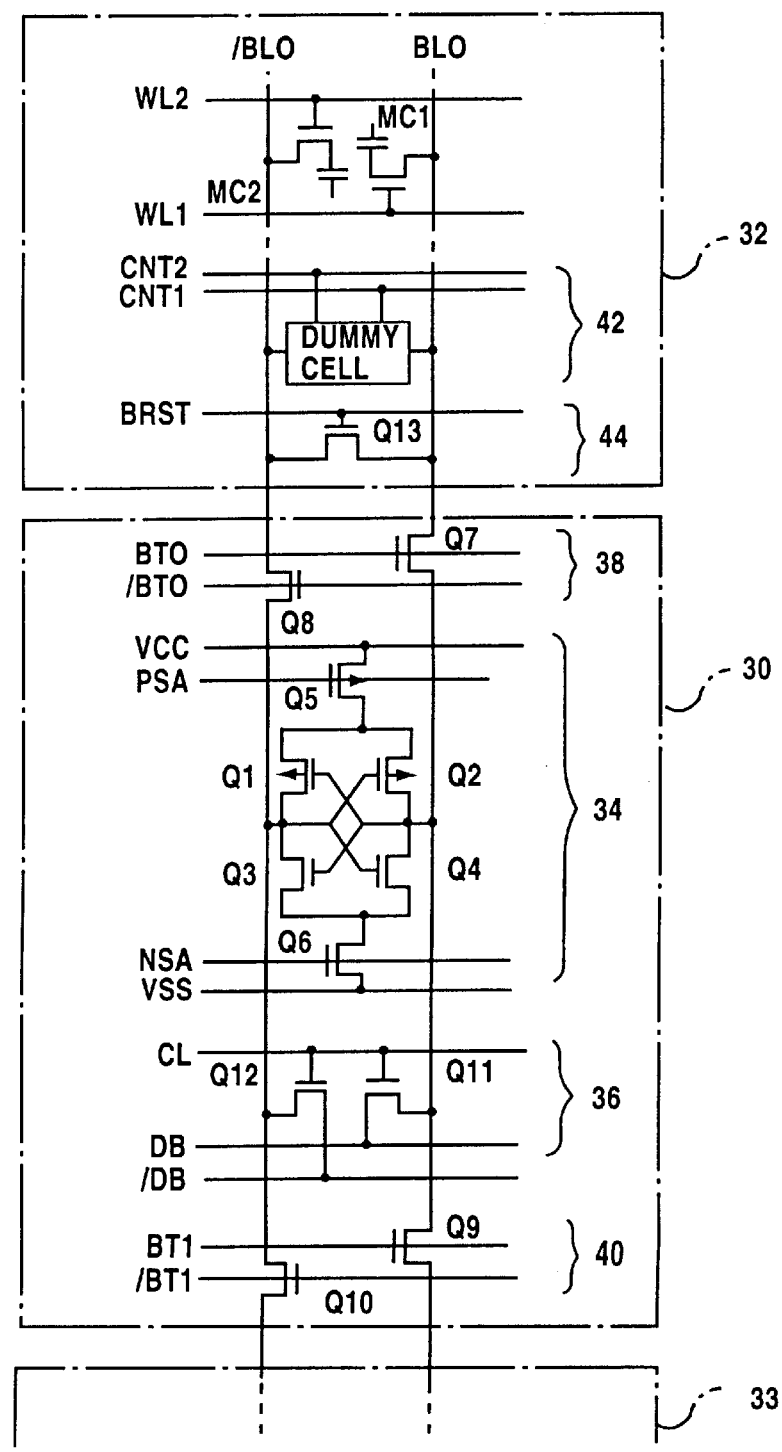
FIG. 9 is a circuit diagram of a semiconductor memory device according to a second embodiment of the present invention.

A description will be given, with reference to FIG. 9, of a DRAM device according to a second embodiment of the present invention. The second embodiment of the present invention is directed to an arrangement in which one sense amplifier part is provided in common to two cell array parts. In FIG. 9, parts that are the same as those shown in the previously described figures are given the same reference numbers.

The circuit configuration shown in FIG. 9 relates to the pair of bit lines BL0 and /BL0. The same circuit configurations as shown in FIG. 9 are provided to the respective pairs of bit lines. As shown in FIG. 9, one sense amplifier part 30 and two cell array parts 32 and 33 are provided to the pair of bit lines BL0 and /BL0. The sense amplifier part 30 is provided in common to the cell array parts 32 and 33. The sense amplifier part 30 includes a sense amplifier 34, a data input/output circuit 36 and transfer gate circuits 38 and 40.

The sense amplifier 34 includes a flip-flop, which is made up of transistors Q1–Q4, and transistors Q5 and Q6. The transistor Q5 selectively connects the power supply voltage VCC to the flip-flop in accordance with the control signal PSA. The transistor Q6 selectively connects the power supply voltage VSS to the flip-flop in accordance with the control signal NSA.

The data input/output circuit 36 includes transistors Q11 and Q12, and connects the bit lines BL0 and /BL0 to the data bus lines DB and /DB, respectively, in accordance with the column select signal CL.

The transfer gate circuit 38 includes transistors Q7 and Q8, and selectively connects the bit lines BL0 and /BL0 to the sense amplifier part 30 in accordance with the transfer control signals BT0 and /BT0, so that the cell array part 32 can be selectively connected to the sense amplifier part 30. The transfer gate circuit 40 includes transistors Q9 and Q10, and selectively connects the bit lines BL0 and /BL0 to the sense amplifier 30 in accordance with the transfer control signals BT1 and /BT1, so that the cell array part 33 can be selectively connected to the sense amplifier 30. When one of the transfer gate circuits 38 and 40 is open, the other transfer gate circuit is closed.

The cell array part 32 includes a plurality of cells (only cells MC1 and MC2 are illustrated in FIG. 9), the dummy cell part 42 and a bit line reset circuit 44. Each cell consists of one capacitor and one transistor.

The bit line reset circuit 44 includes a transistor Q13, and short-circuits the bit lines BL0 and /BL0 when the bit line reset signal BRST is activated. Hence, the bit lines BL0 and /BL0 are reset.

Figure 10:
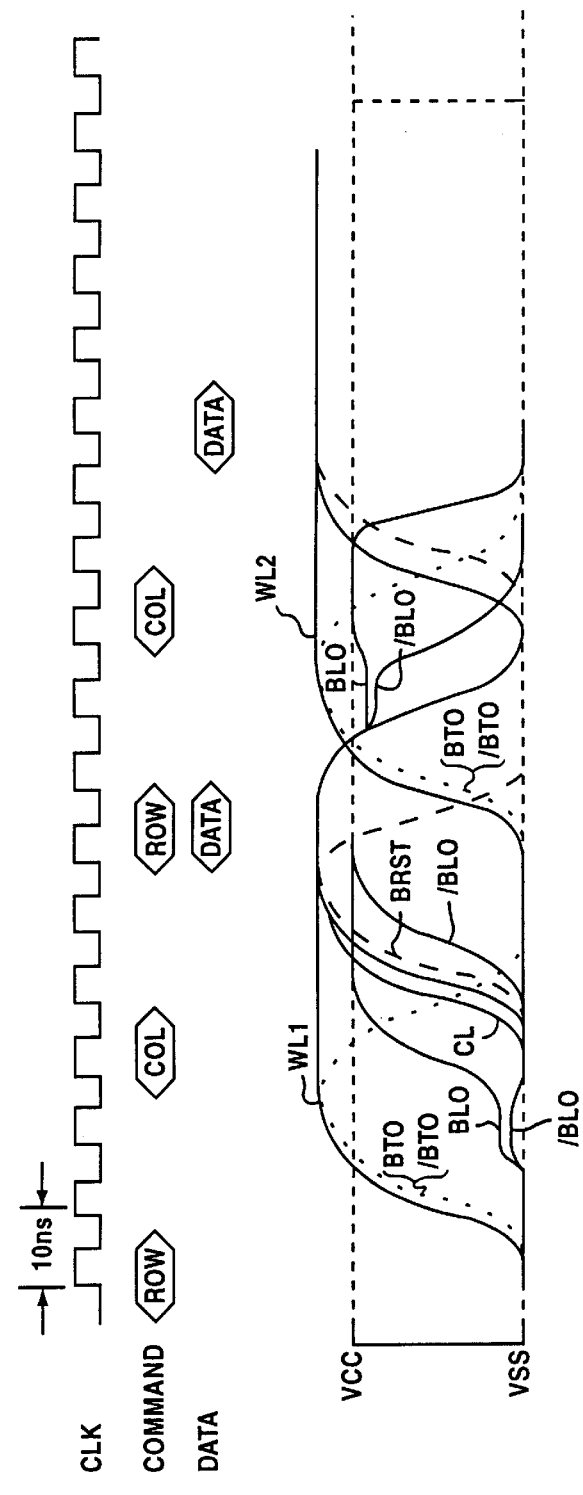
FIG. 10 is a waveform diagram of an operation of the circuit shown in FIG. 9.

An operation of the DRAM device shown in FIG. 9 will be described with reference to FIG. 10.

When the row address command ROW is applied to the DRAM device in a state in which the bit lines BL0 and /BL0 are in the reset state, the command ROW is decoded by a decoder (not shown in FIG. 9), which selects a corresponding word line WL. It will now be assumed that the word line WL1 shown in FIG. 8 is selected. The transfer control signals BT0 and /BT0 are simultaneously activated in order to connect the cell array part 32 to the sense amplifier 30.

If the cell MC1 connected to the selected word line WL1 holds data "1", the charge stored in the cell MC1 flows to the bit line BL0, the potential of which is increased. The transistor Q15 of the dummy cell part 42 is turned ON, and thus the charge stored in the capacitor C thereof flows to the bit line /BL0 which is at VSS. Hence, the potential of the bit line /BL0 is increased. The cell MC1 is charged by VCC, while the capacitor C is charged by VCC/2. Hence, the potential of the bit line /BL0 is lower than that of the bit line BL0.

The potential difference between the bit lines BL0 and /BL0 thus produced is sensed by the sense amplifier 34. The potential of the bit line BL0 is rapidly increased toward VCC, while the potential of the bit line /BL0 is decreased toward VSS. Since the sense amplifier 34 has sensed the data read from the cell MC1, the transfer control signal /BT0 is turned OFF in order to disconnect the bit line /BL0 from the sense amplifier 34. The sense amplifier 34 is still connected to the bit line BL0.

In order to output the sensed data to the data bus lines DB and /DB, the column address command COL is decoded and the column select signal CL is thus activated. Hence, the data stored in the cell MC1 and latched by the sense amplifier 34 is output to the data bus lines DB and /DB.

Then, the bit line reset signal BRST is activated in order to reset the bit lines BL0 and /BL0. As has been described previously, the bit lines BL0 and /BL0 can be reset by setting the potential of the not-selected-side bit line /BL0 to the potential of the selected-side bit line BL0. Since the bit line BL0 located on the selected side is connected to VCC via the sense amplifier 34, the potential of the bit line /BL0 is increased toward VCC. When the potential of the bit line /BL0 becomes equal to VCC, the bit line reset signal BRST is turned OFF. At the same time, the transfer control signal BT0 falls, and the sense amplifier 34 is disconnected from the selected-side bit line BL0. In the example shown in FIG. 9, the word line WL2 is selected and the cell array 32 is selected. Hence, the transfer control signal BT0 continues to be selected.

After the sense amplifier 34 senses the data, the control signal CNT3 shown in FIG. 7 turns ON the transistor Q16, so that the capacitor C is charged by VCC/2.

In the above manner, the bit lines BL0 and /BL0 are reset, and the device is ready for the next read operation.

It will now be assumed that the word line WL2 is selected for the next read cycle and the cell MC2 holds data "0". In this case, the transistor Q14 shown in FIG. 7 is selected. Since the cell MC2 stores data "0", a charge flows to the capacitor of the cell MC2 from the bit line /BL0, the potential of which is then decreased. The transistor Q14 is turned ON, and a charge flows to the capacitor C from the bit line BL0 which is at VCC. In this case, the capacitor C is charged by VCC/2, the potential of the bit line BL0 is not decreased as much as the potential of the bit line /BL0. The potential difference between the bit lines BL0 and /BL0 thus produced is sensed by the sense amplifier 34. After the data is sensed, the potential of the non-selected-side bit line BL0 is set equal to the potential of the selected-side bit line /BL0. Hence, the bit lines BL0 and /BL0 are reset and the DRAM device is ready for the next read cycle.

The above read operation does not require the command PRE for precharging the bit lines. Further, the row address command ROW for the next read cycle can be placed immediately after the command COL for the previous read cycle. Hence, the read operation can be carried out at a higher speed.

In the above structure, the resetting (precharging) of the sense amplifier 34 is omitted for the sake of simplicity.

A description will now be given, with reference to FIG. 11, of a DRAM device according to a third embodiment of the present invention, in which parts that are the same as those of the first and second embodiments of the present invention are given the same reference numbers.

The third embodiment of the present invention is directed to an arrangement in which the dummy cell circuit 42 is provided in a sense amplifier part 300 in order to further increase the speed of the read operation. In the arrangement of the third embodiment of the present invention, the flip-flop circuit 34 of the sense amplifier part 300 senses the internal bit lines BL and /BL of the sense amplifier 300. When the sense operation is carried out, cell array parts 320 and 330 are disconnected from the sense amplifier 300. Hence, the sense operation speed depends on the loads of the internal bit lines BL and /BL. In the configuration shown in FIG. 9, the sense operation speed depends on the loads of the bit lines BL0 and /BL0, which are longer than the internal bit lines BL and /BL shown in FIG. 11, and is thus lower than that of the configuration shown in FIG. 11. Hence, the configuration shown in FIG. 11 consumes a decreased amount of energy.

Figure 11:
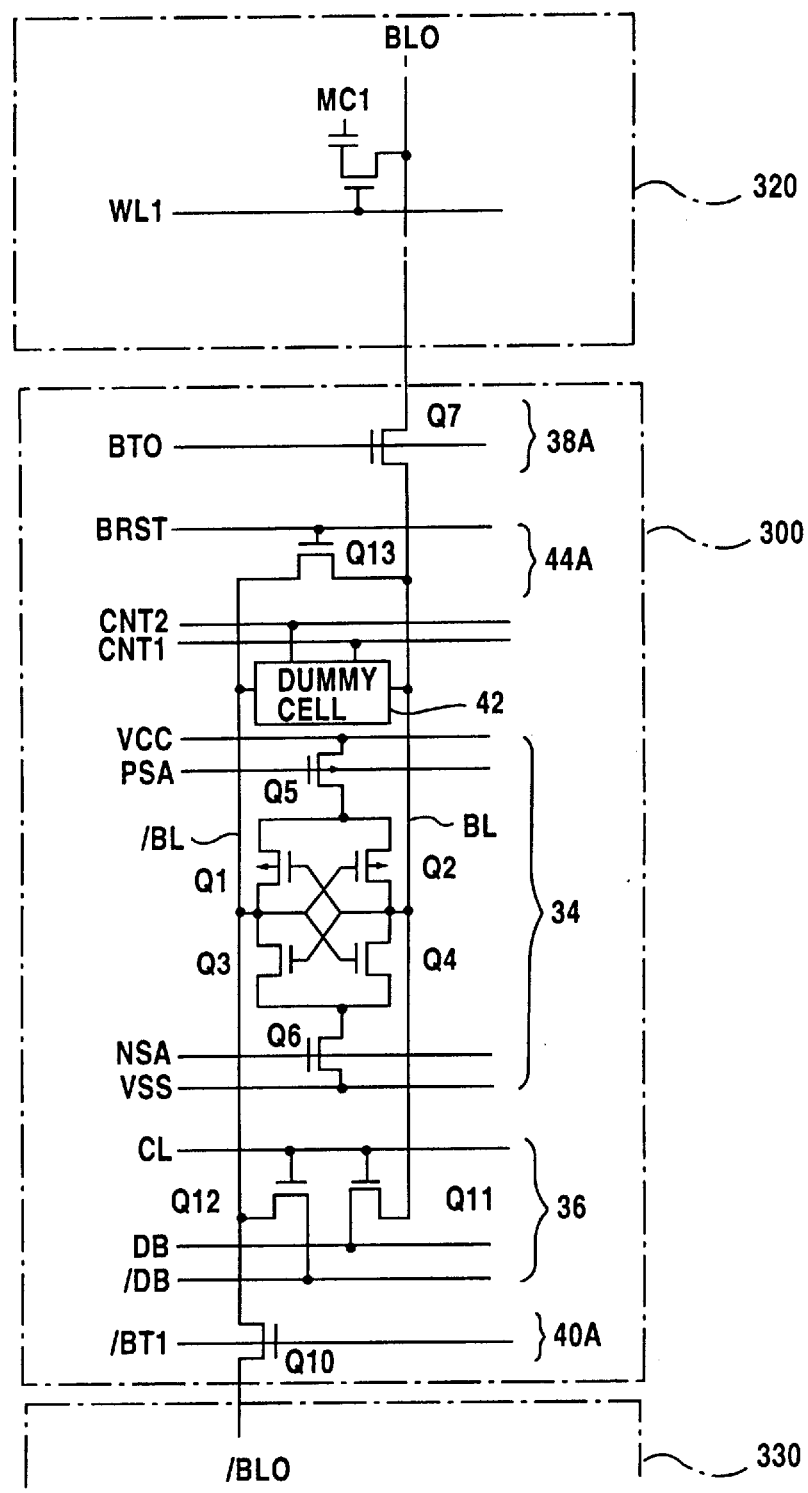
FIG. 11 is a circuit diagram of a semiconductor memory device according to a third embodiment of the present invention.

The cell array parts 320 and 330 shown in FIG. 11 are different from the cell array parts 32 and 33. More particularly, the cell array part 320 includes only the bit line BL0, while the cell array part 330 includes only the bit line /BL0. That is, either the bit line BL0 or /BL0 is driven with respect to the sense amplifier 300.

The sense amplifier part 300 includes transfer gate circuits 38A and 40A, the dummy cell circuit 42 and a bit line reset circuit 44A in addition to the flip-flop circuit 34 and the data input/output circuit 36. The transfer gate circuit 38A includes the transistor Q7, and the transfer gate circuit 40A includes the transistor Q10. The dummy cell part 42 shown in FIG. 11 is the same as shown in FIG. 7 except that the dummy cell part 42 is connected to the internal bit lines BL and /BL of the sense amplifier part 300. The bit line reset circuit 44A resets the internal bit lines BL and /BL of the sense amplifier part 300.

Figure 12:
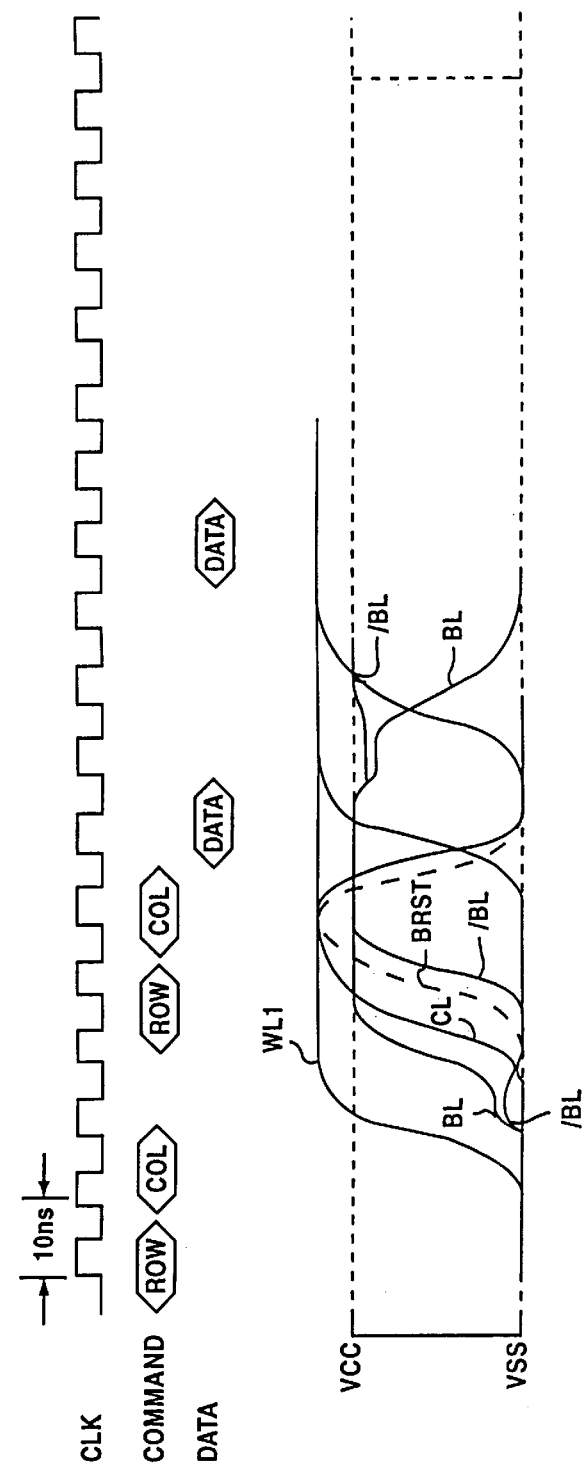
FIG. 12 is a waveform diagram of an operation of the circuit shown in FIG. 11.

FIG. 12 is a waveform diagram of an operation of the DRAM device shown in FIG. 11.

The row address command ROW is applied to the device in the state in which the bit lines BL and /BL are in the reset state, and is then decoded. It will now be assumed that the word line WL1 shown in FIG. 11 is selected. Simultaneously, the transfer control signal BT0 is activated in order to connect the cell array part 320 to the sense amplifier part 30.

If the cell MC1 connected to the selected word line WL1 holds data "1", the charge stored therein flows to the bit line BL0, and the potential of the bit line BL0 is increased. Hence, the potential of the internal bit line BL of the sense amplifier 300 is also increased. The transistor Q15 of the dummy cell part 42 is turned ON, and the charge stored in the capacitor C flows to the internal bit line /BL which is at VSS. Hence, the potential of the internal bit line /BL is increased. The cell MCI is charged by VCC, while the capacitor C is charged by VCC/2. Hence, the potential of the internal bit line /BL is lower than that of the internal bit line BL.

The potential difference between the internal bit line BL and /BL thus produced is sensed by the flip-flop circuit 34. At this time, the transistor Q7 is turned OFF and the cell array part 320 is disconnected from the sense amplifier part 300. The potential of the internal bit line BL is rapidly L increased toward VCC, and the potential of the internal bit line /BL is decreased toward VSS.

In order to output the sensed data to the data bus lines DB and /DB, the column address command COL is decoded, and the column select signal CL is activated. Hence, the data latched by the flip-flop circuit 34 is output to the data bus lines DB and /DB.

Then, the bit line reset signal BRST is activated, and the reset operation on the internal bit lines BL and /BL is started. The internal bit lines BL and /BL are reset by setting the potential of the not-selected-side internal bit line /BL to that of the selected-side internal bit line BL. Hence, the potential of the internal bit line /BL is increased toward VCC. When the potential of the internal bit line /BL becomes equal to VCC (which is the reset potential for the next read cycle), the bit line reset signal BRST is turned OFF.

After the sense amplifier 34 senses the data, the control signal CNT3 shown in FIG. 7 turns ON the transistor Q16 so that the capacitor C is charged to VCC/2.

The next read operation can be carried out immediately after the bit lines BL and /BL are reset. Hence, the external commands relating to the read operation can be arranged, as shown in FIG. 12. Since the speed of the sense operation is increased, the commands can be arranged so as to be close to each other.

In FIG. 11, the bit lines extend from both sides of the sense amplifier 300. Alternatively, the bit lines may extend from only one side of the sense Li amplifier 300. The resetting (precharging) of the sense amplifier 34 is omitted for the sake of simplicity.

Figure 13:
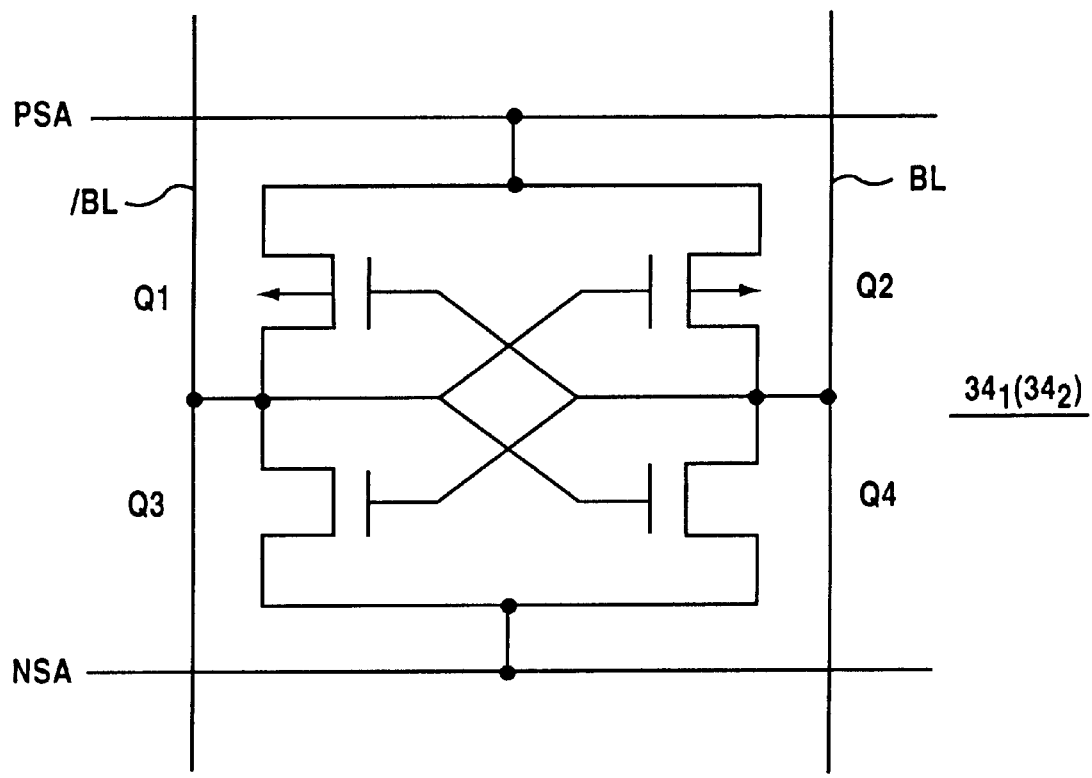
FIG. 13 is a circuit diagram of another configuration of the sense amplifier.

Each of the sense amplifiers 34, $34_1$, $34_2$ used in the first through third embodiments of the present invention consists of six transistors. Alternatively, a sense amplifier consisting of two P-channel transistors Q1 and Q2 and two N-channel transistors Q3 and Q4 can be employed. In the configuration shown in FIG. 13, the sense amplifier is ON when the control signals PSA and NSA are respectively high and low. The sense amplifier shown in FIG. 6 is ON when the control signals NSA and PSA are respectively high and low.

A description will now be given of a DRAM device according to a fourth embodiment of the present invention.

As has been described previously, the first embodiment of the present invention uses two sense amplifiers $34_1$ and $34_2$ respectively provided on both sides of the bit lines BL0 and /BL0. When one of the sense amplifiers 341 and $34_2$ senses data, the other sense amplifier precharges (resets) the bit lines BL0 and /BL0. Further, the bit lines (nodes) of the sense amplifier which senses data are reset (to the floating state) by the other sense amplifier after the sense operation is completed. In this manner, the sense amplifier which senses data is released from the data latching state.

Figure 14A:
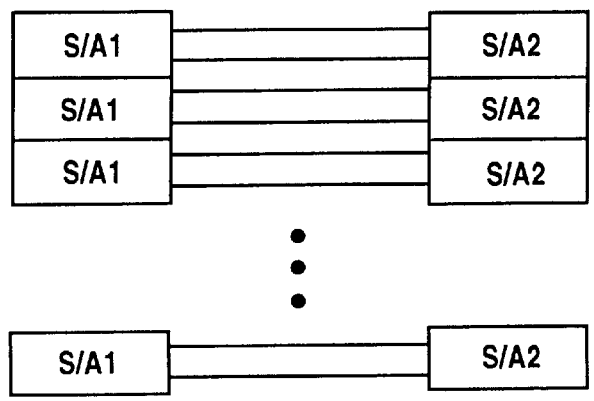
FIGS. 14A and 14B are block diagrams of arrangements of sense amplifiers.
Figure 14B:
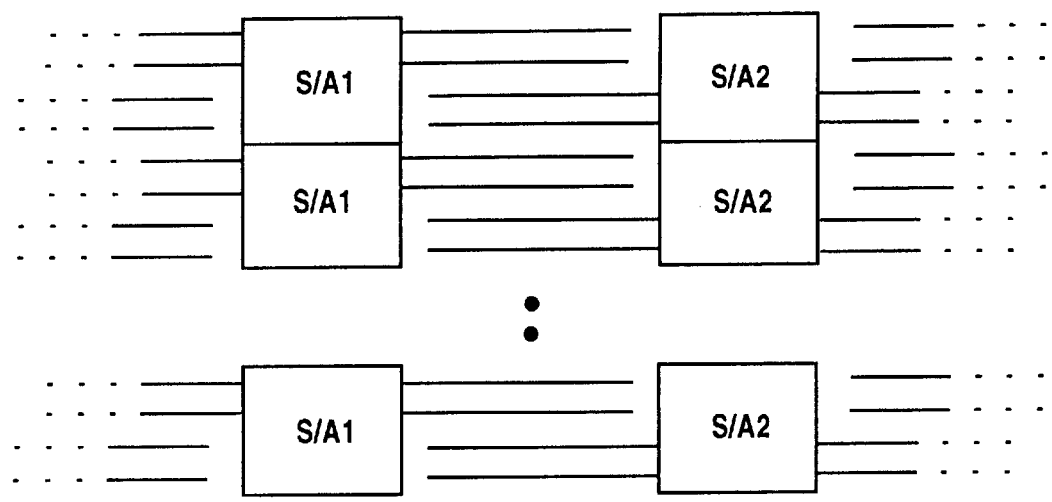

The above configuration can realize an arrangement as shown in FIG. 14A, in which sense amplifiers S/A1 and S/A2 are provided to respective sides of a pair of bit lines. However, the configuration of the first embodiment of the present invention does not realize an arrangement as shown in FIG. 14B in which each of the sense amplifiers S/A1 and S/A2 are shared by a plurality of pairs of bit lines. The fourth embodiment of the present invention is directed to realizing the arrangement shown in FIG. 14B.

According to the fourth embodiment of the present invention, there is provided means for precharging the bit lines and the sense amplifier (more particularly, the bit lines of the sense amplifier). It will be seen from the following description that the above means can be applied to the second and third embodiments of the present invention in order to reset the bit lines within the sense amplifiers.

Figure 15:
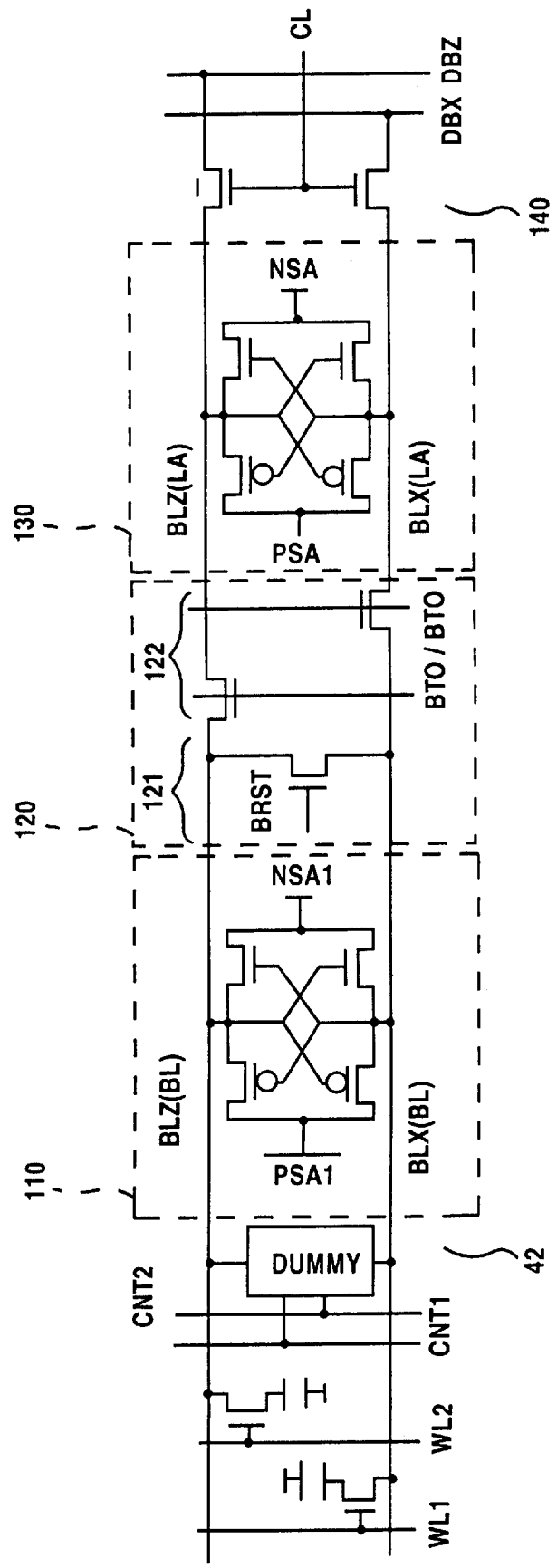
FIG. 15 is a circuit diagram of a semiconductor memory device according to a fourth embodiment of the present invention.

FIG. 15 is a circuit diagram of the DRAM device according to the fourth embodiment of the present invention. The configuration shown in FIG. 15 relates to a pair of bit lines, and the same configurations as shown in FIG. 15 are provided to the respective pairs of bit lines. The configuration shown in FIG. 15 includes the dummy cell circuit 42, a sense amplifier 110 consisting of four transistors, a precharge control circuit 120, a precharge control circuit 130, and a data input/output circuit 140.

The precharge circuit 130 simultaneously precharges a pair of bit lines BLX(BL) and BLZ(BL) and a pair of bit lines BLX(LA) and BLZ(LA) located on the same side as that on which the sense amplifier 110 is located. The precharge circuit 130 has the same configuration as the sense amplifier 110, and thus has the function of latching data. The precharge circuit 120 includes a bit line reset circuit 121 and a transfer gate 122. The bit line reset circuit 121 includes an N-channel MOS transistor. The transfer gate 122 includes two N-channel MOS transistors. The precharge circuit 120 controls the precharge operation on the pair of bit lines BLX(BL) and BLZ(BL) and the pair of bit lines BLX(LA) and BLZ(LA).

A description will now be given, with reference to FIG. 16, of an operation of the configuration shown in FIG. 15.

Figure 16:
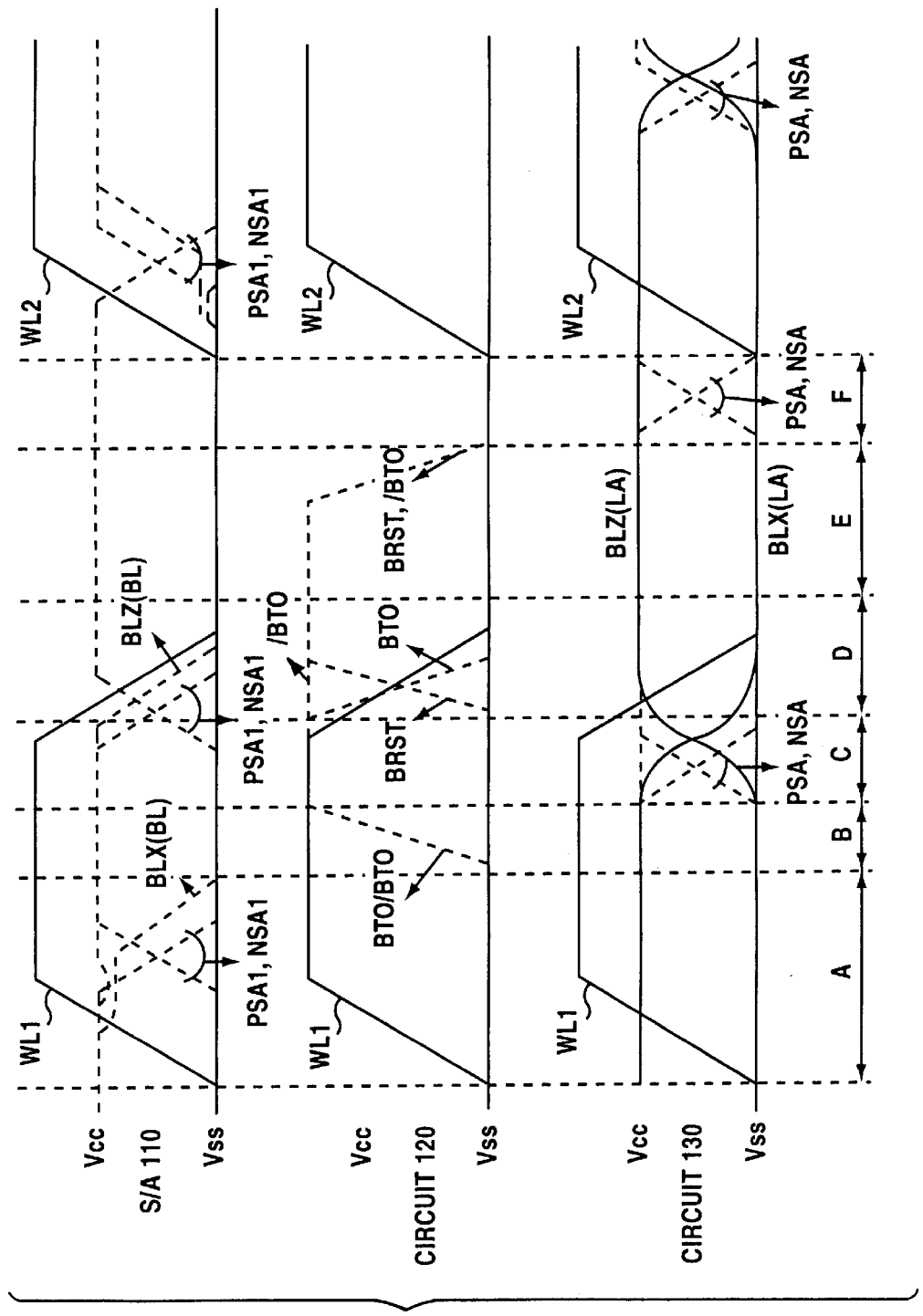
FIG. 16 is a waveform diagram of an operation of the circuit shown in FIG. 15.

The following description will be separately given with respect to sections A through F shown in FIG. 16.

Section A

The word line WL1 is selected in a state in which the bit lines BLX(BL) and BLZ(BL) are precharged to the high level. Data stored in the cell connected to the selected word line WL1 is output to the bit line BLX(BL) to which the selected memory cell is connected. In the example shown in FIG. 16, data "0" is output from the selected memory cell. Simultaneously, data is output to the not-selected-side bit line BLZ(BL) from the dummy cell circuit 42. As has been described previously, the capacitor C of the dummy cell circuit 42 is charged by VCC/2. Hence, the potential of the selected-side bit line BLX(BL) connected to the selected cell becomes lower than the potential of the not-selected-side bit line BLZ(BL) connected to the dummy cell circuit 42. The sense amplifier 110 is turned ON by the control signals NSA1 and PSA1, and amplifies the slight potential difference between the bit lines BLX(BL) and BLZ(BL).

Section B

The precharge control circuit 120 transfers the data amplified by the sense amplifier 110 to the precharge circuit 130. After the sense amplifier 110 latches the data, the transfer control signals BT0 and /BT0 are turned ON, and the two transistors of the transfer gate 122 are turned ON. Hence, the latched data is transferred to the precharge circuit 130.

Section C

The control signals PSA and NSA are inverted, and the precharge circuit 130 is turned ON. At this time, the control signals PSA1 and NSA1 are inverted, and the sense amplifier 110 is turned OFF. This is because the sense amplifier 110 must be OFF in order to make it possible to precharge the sense amplifier 110 and the bit lines BLX(LA) and BLZ(LA).

Section D

The sense amplifier 110 (the bit lines BLX(BL) and BLZ(BL)) and the bit lines BLX(LA) and BLZ(LA) are precharged. In the section D, the transfer control signal BT0 is turned OFF (switched to the low level) in order to disconnect the precharge circuit 130 from the bit line connected to the selected cell (cell connected to the word line WL1 in the present case), that is, the not-selected-side bit line (bit line BLZ(BL) in the present case). Then, the bit line reset signal BRST is activated (switched to the high level) in order to turn ON the transistor of the bit line reset circuit 121. Hence, the bit lines BLX(BL) and BLZ(BL) are short-circuited so that the potential of the not-selected-side bit line BLZ(BL) is precharged to the low level. That is, the bit line BLX(LA) of the precharge circuit 130 is at the low level, and the bit line BLZ(BL) of the sense amplifier 110 is at the high level. Hence, the charge of the bit line BLZ(BL) flows to the line NSA via the bit line reset circuit 121, the transistor on the /BT0 side, the bit line BLX(LA) and the N-channel MOS transistor.

When the column select signal CL is activated in the section D, the read data can be output to data bus lines DBX and DBZ.

Section E

In this state, the precharge operation on the bit lines BLZ(BL) and BLX(BL) of the sense amplifier 110 is completed. In the precharge circuit 130, the bit line BLX(LA) is at the low level, and the bit line BLZ(LA) is at the high level. This means that the read data is latched by the precharge circuit 130. Then, the transfer control signal /BT0 is decreased, and the bit line reset signal BRST is decreased.

Section F

The control signals PSA and NSA are inverted, and the precharge circuit 130 is turned OFF. Hence, an increased timing margin for latching new data can be obtained.

As described above, the precharge circuit 130 is capable of precharging the bit lines BLZ(BL) and BLX(BL) extending from the sense amplifier 110. Hence, the configuration shown in FIG. 15 can be simpler than the configuration shown in FIG. 4. It should be noted that the configuration shown in FIG. 15 can realize the arrangement shown in FIG. 14B.

Figure 17:
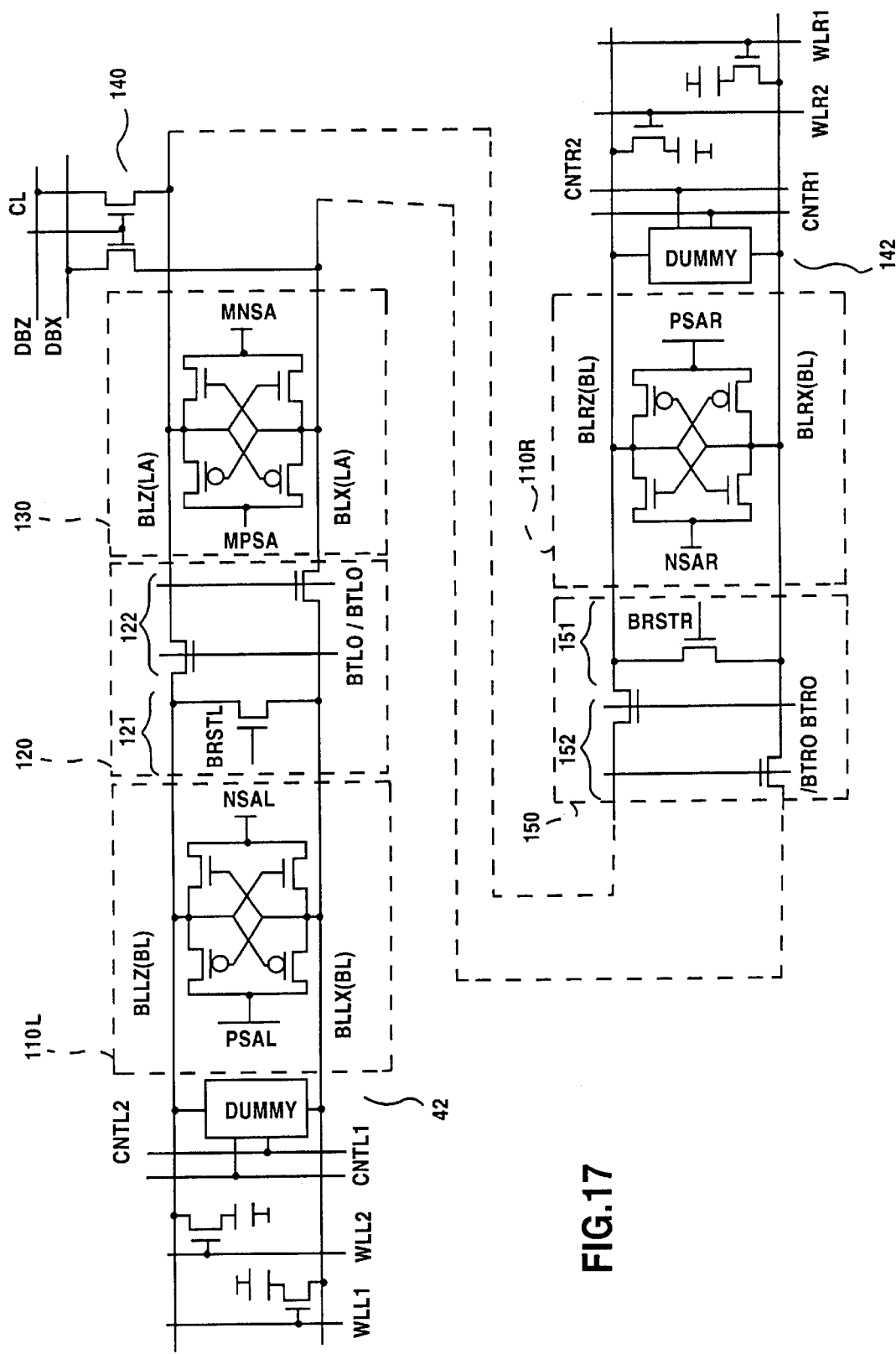
FIG. 17 is a circuit diagram of a semiconductor memory device according to a fifth embodiment of the present invention.

FIG. 17 is a circuit diagram of a DRAM device which employs the configuration shown in FIG. 15 and has the arrangement shown in FIG. 14 according to a fifth embodiment of the present invention. In FIG. 17, parts that are the same as those shown in the previously described figures are given the same reference numbers.

The configuration shown in FIG. 17 has an arrangement in which one precharge circuit 130 is provided in common to the left sense amplifier 110L and the right sense amplifier 110R. The precharge circuit 130 precharges both the sense amplifiers 110L and 110R. In the following description, suffixes "L" and "R" are added to the reference numbers in order to discriminate the components on the left side from those on the right side. For example, word lines located on the left side are denoted by such as WLL1 and WLL2, and word lines located on the right side are denoted by such as WLR1 and WLR2.

The circuit part shown on the upper side of FIG. 17 is the same as the circuit configuration shown in FIG. 15. The circuit part shown on the lower side of FIG. 17 includes a cell array, a dummy cell circuit 142, the right sense amplifier 110R and a right precharge control circuit 150. The right precharge control circuit 150 is the same as the left precharge control circuit 120, and includes a bit line reset circuit 151 and a transfer gate 152. The data input/output circuit 140 and the data bus lines DBX and DBZ shown in FIG. 17 are the same as those shown in FIG. 15.

Figure 18:
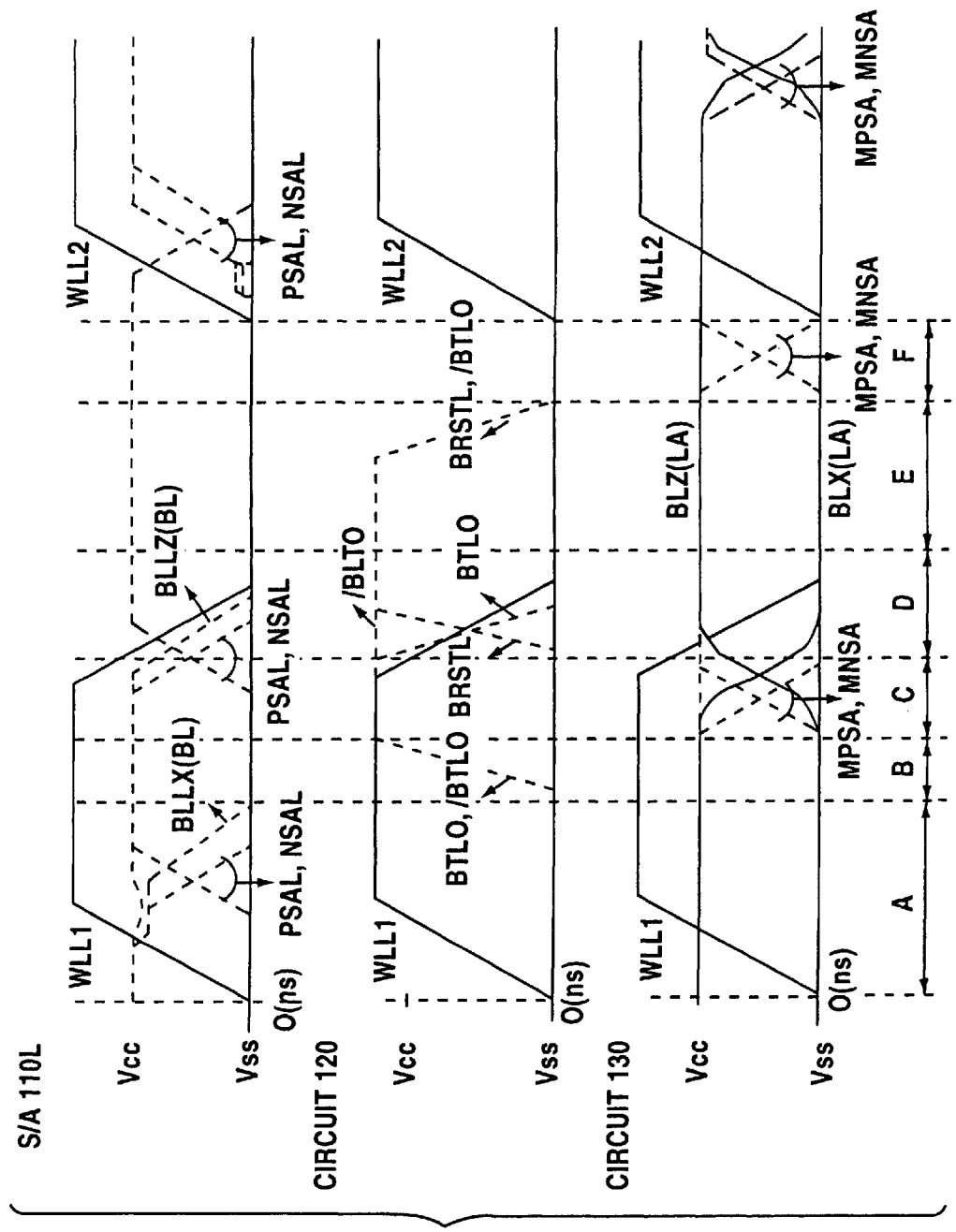
FIG. 18 is a waveform diagram of an operation of the circuit shown in FIG. 17.
Figure 19:
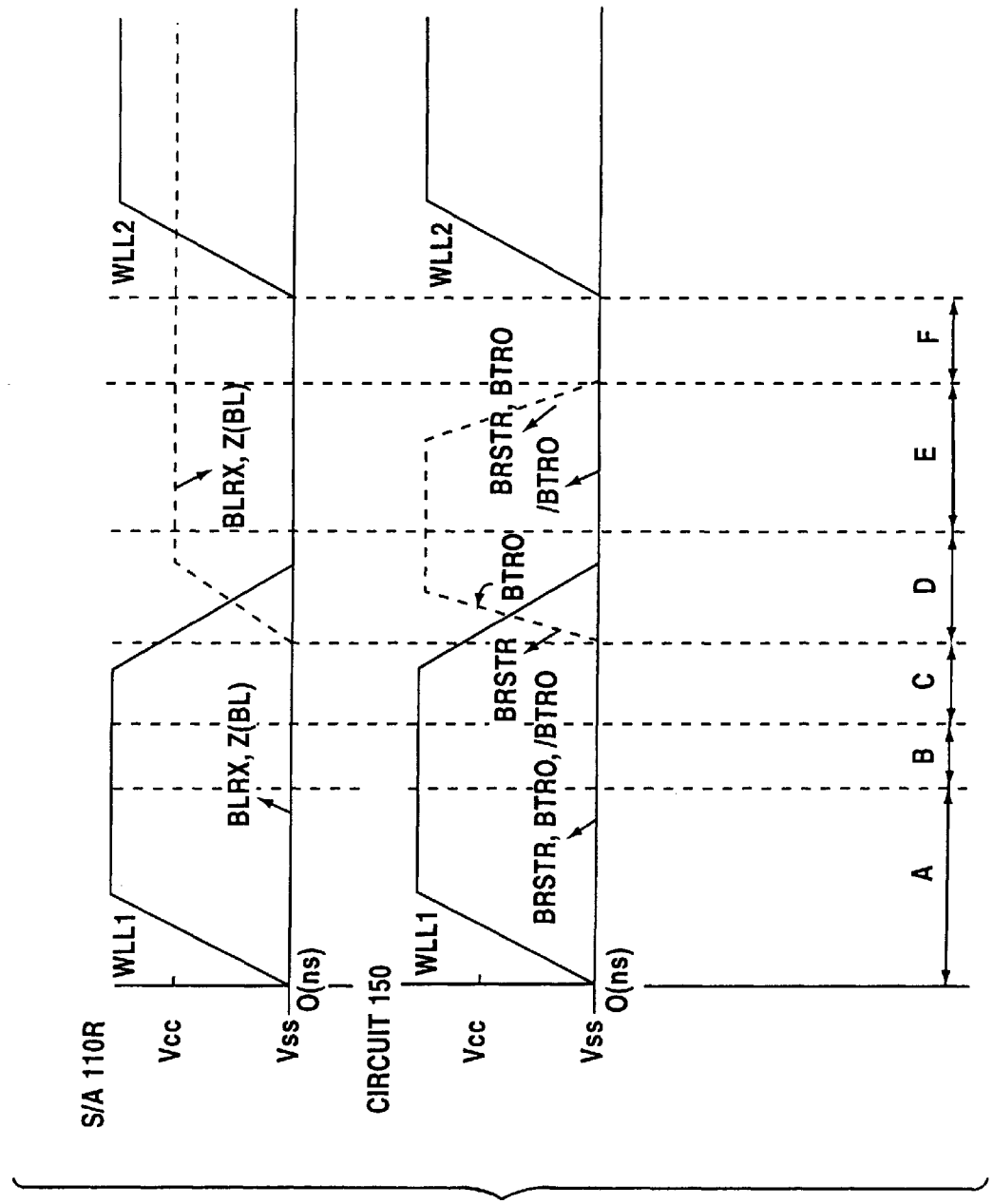
FIG. 19 is another waveform diagram of the operation of the circuit shown in FIG. 17.

A description will now be given, with reference to FIGS. 18 and 19, of an operation of the configuration shown in FIG. 17. FIG. 18 is a waveform diagram of an operation of the circuit part located at the left side of the precharge circuit 130, and FIG. 19 is a waveform diagram of an operation of the circuit part located at the right side thereof. The waveform diagram of each of FIGS. 17 and 18 has sections A through F.

Referring to FIG. 18, it will now be assumed that the cell connected to the word line WLL1 is selected. The operation of the left circuit part is the same as has been described previously with reference to FIG. 16. That is, the sections A through F shown in FIG. 18 are the same as those shown in FIG. L6. Hence, a description of the operation of the left circuit part will be omitted.

The right precharge control circuit 150 operates in a manner different from the left precharge control circuit 120. Referring to FIG. 19, the right sense amplifier 110R has the precharged level opposite to that of the left sense amplifier 110L in a standby state which corresponds to the origin of FIG. 19. That is, the bit lines BLRX(BL) and BLRZ(BL) in the right sense amplifier 110R are at the low level. When the left sense amplifier 110L is sensing data stored in the selected memory cell on the left side (in the section C shown in FIG. 18), transfer control signals BTR0 and /BTR0 applied to the right precharge control circuit 150 are at the low level. Hence, the right sense amplifier 110R is disconnected from the precharge circuit 130 and is maintained in the floating state. When the sense operation of the left sense amplifier 110L is completed and the precharge operation is started (in the section D in FIG. 18), the precharge operation on the right circuit part is simultaneously started (in the section D shown in FIG. 19). In the precharging operation, the left circuit part is precharged to VSS, whereas the right circuit part is precharged to VCC in order to reduce the load of the precharge circuit 130. More particularly, in the section D shown in FIG. 18, the transfer control signal /BTL0 is ON, and the precharge circuit 130 precharges the potential of the bit line BLLZ(BL) to the potential VSS of the bit line BLX(LA). Thus, in the section D shown in FIG. 19, the transfer control signal BTR0 is turned ON at the same time as the bit line reset signal BRST, and the precharge circuit 130 precharges the potential of the bit lines BLRX(BL) and BLRZ(BL) to the potential VCC of the bit line BLZ(LA). Hence, the bit lines can be prevented from being in the floating state when the bit lines are not activated (OFF).

As described above, the configuration shown in FIG. 17 can realize the arrangement shown in FIG. 14B and further makes it possible to use one precharge (circuit in common to the right and left circuits. This is advantageous to designing the layout of the DRAM device.

A description will now be given, with reference to FIG. 20, of a DRAM device according to a sixth embodiment of the present invention, in which parts that are the same as those shown in the previously described figures are given the same reference numbers. The configuration shown in FIG. 20 can be obtained by adding a pass-through current block gate 160 to the configuration shown in FIG. 15. The pass-through current block gate 160 can be applied to the configuration shown in FIG. 17.

The configuration shown in FIG. 15 has a possibility that a pass-through current may flow in the following manner. In a case where the column select signal CL is turned ON in a state in which the cell arrays are in an inactive state (none of cells are selected: hereinafter such cell arrays will be referred to as inactive arrays) and the precharge circuit 130 is in the data latching state, if the data latched in the precharge circuit 130 and the precharged level of the data bus lines DBX and DBZ are different from each other, a pass-through current will flow from the data bus line DBX or DBZ to the control line PSA or NSA of the precharge circuit 130 via the data input/output circuit 140. Usually, the pass-through current flows under the situation in which a plurality of sense amplifiers share the data bus lines as shown in FIG. 17. In the configuration shown in FIG. 17, the above pass-through current flows when the column select signal CL is turned ON in the case where the memory cell arrays of the left and right circuit part are in the inactive and active states, respectively. The active state is defined as a state in which a word line is activated and the corresponding cell is selected: hereinafter the array in such a state will be referred to as an active array.

The pass-through current block gate 160 includes two N-channel MOS transistors. A gate control signal CLD is applied to the gates of the two MOS transistors. When the word line is selected and the sense amplifier is enabled, the pass-through current block gate 160 must be opened. Hence, the gate control signal CLD must be turned ON before or when the column select signal CL is turned ON. In the sixth embodiment of the present invention, the gate control signal CLD is synchronized with the control signals PSA and NSA, and the gate control signal CLD is turned ON before the column select signal CL is turned ON.

Figure 20:
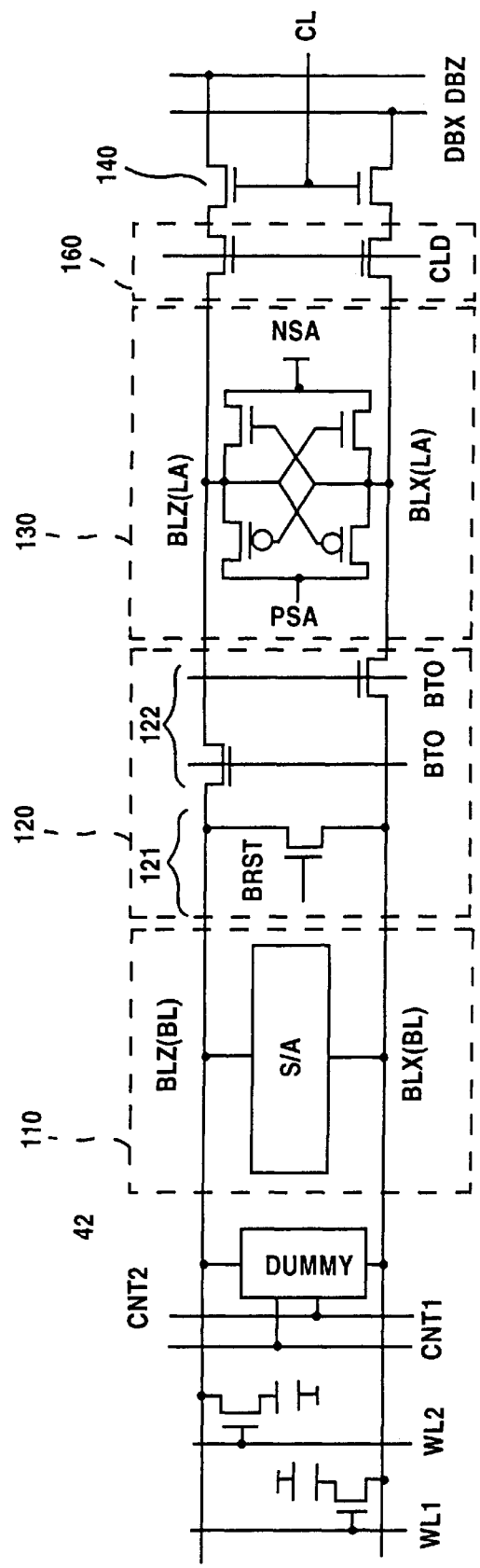
FIG. 20 is a circuit diagram of a semiconductor memory device according to a sixth embodiment of the present invention.
Figure 21:
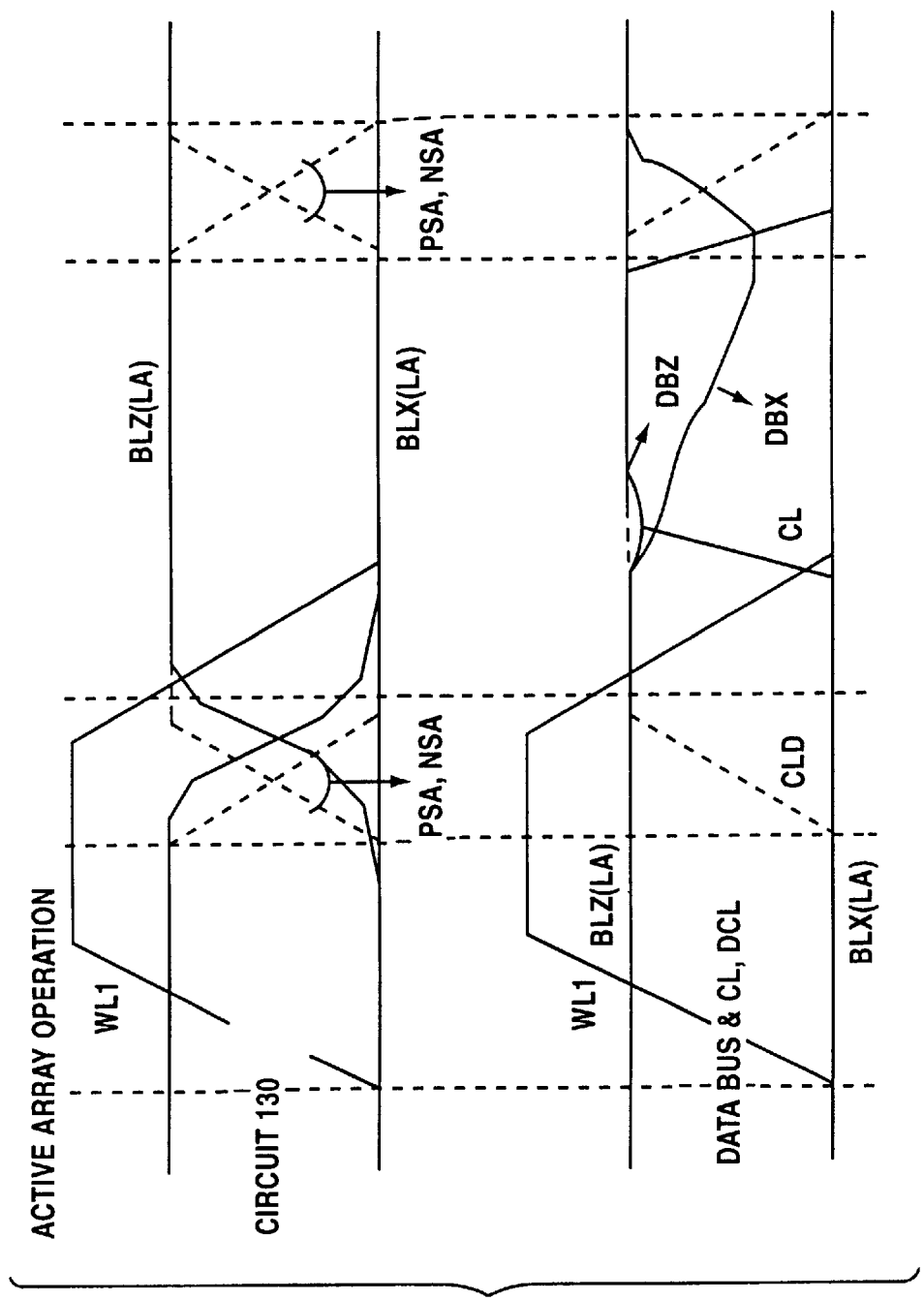
FIG. 21 is a waveform diagram of an operation of the circuit shown in FIG. 20.

FIG. 21 is a waveform diagram of an operation of the active array in the configuration shown in FIG. 20. The gate control signal CLD is turned ON and the pass-through current block gate 160 is opened when the control signals PSA and NSA are inverted and the precharge circuit 130 is turned ON. Thereafter, the column select signal CL is turned ON, and data latched in the precharge circuit 130 is transferred to the data bus lines DBX and DBZ.

Figure 22:
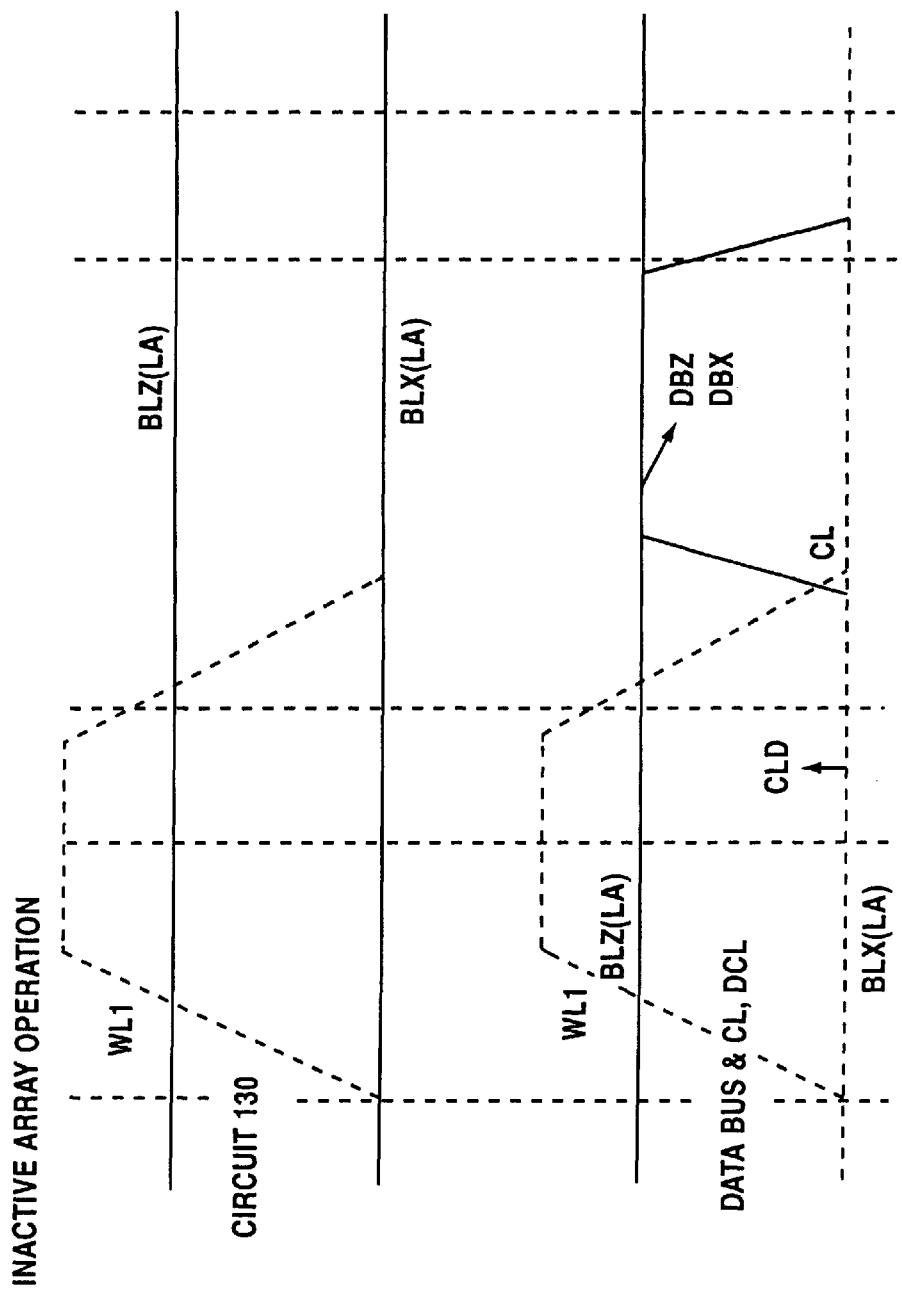
FIG. 22 is another waveform diagram of the operation of the circuit shown in FIG. 20.

FIG. 22 is a waveform diagram of an operation of the inactive array in the configuration shown in FIG. 20. When the memory cell is not selected, the gate control signal CLD is maintained at the low level (OFF). Hence, even if the column select signal CL is turned ON, the precharge circuit 130 is disconnected from the data bus lines DBX and DBZ. Hence, the pass-through current does not-flow at all.

The data input/output circuit 140 may have a configuration other than the configuration shown in FIG. 20 which has two transistors.

A description will now be given, with reference to FIG. 23, of a DRAM device according to a seventh embodiment of the present invention, in which parts that are the same as those shown in the previously described figures are given the same reference numbers. The seventh embodiment of the present invention employs a direct-sense circuit 180. In the following description, the data bus lines DBX and DBZ are precharged to VCC.

The direct-sense circuit 180 includes transistors Q21 through Q28. The bit lines BLZ(LA) and BLX(LA) are received by the gates of the transistors Q25 and Q26, and the drains thereof are connected to the data bus lines DBX and DBZ. Data read from the selected memory cell and latched in the precharge circuit 130 controls the ON/OFF of the transistors Q25 and Q26, so that the data can be transferred to the data bus lines DBX and DBZ. When data is written into a selected memory cell, a write column select signal WCLE is turned ON, and the transistors Q23 and Q24 are thus turned ON. Write data on the data bus lines DBX and DBZ passes through the transistors Q21–Q24, and is applied to the precharge circuit 130.

When the cell is not selected, the control signal NSA of the precharge circuit 130 is high. With the above in mind, the sources of the transistors Q27 and Q28 are connected to a node of the precharge circuit 130 to which the control signal NSA is applied. Hence, even if the column select signal CL turned ON and the transistors Q25 and Q26 are turned ON, the pass-through current does not flow to the node NSA of the precharge circuit 130 from the data bus lines DBX and DBZ.

Figure 23:
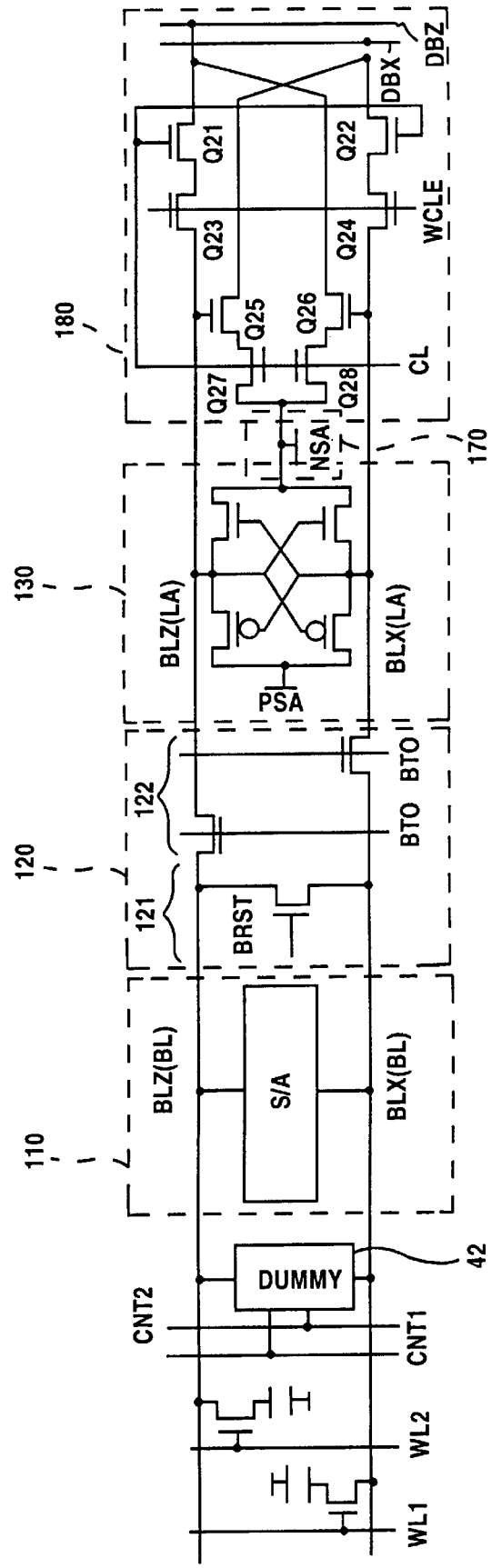
FIG. 23 is a circuit diagram of a semiconductor memory device according to a seventh embodiment of the present invention.
Figure 24:
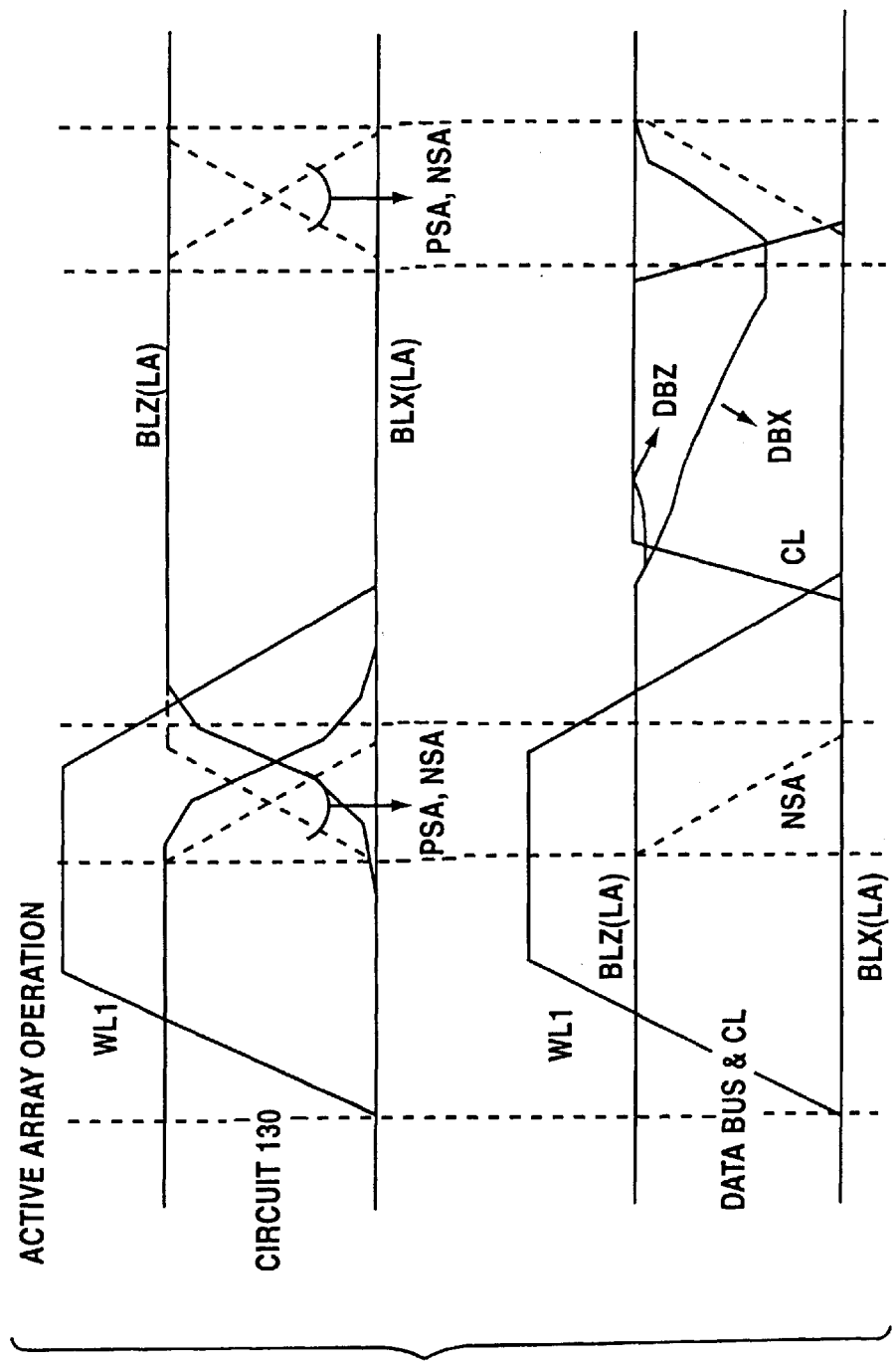
FIG. 24 is a waveform diagram of an operation of the circuit shown in FIG. 23.

FIG. 24 is a waveform diagram of an operation of the active array in the configuration shown in FIG. 23. In this case, the control signals NSA and PSA applied to the precharge circuit 130 are set to the low and high levels, respectively. Then, the column select signal CL is turned ON. In the case shown in FIG. 24, the transistor Q25 is turned ON because the bit line BLZ(LA) is at the high level. Hence, a current flows to the node NSA of the precharge circuit 130 from the data bus line DBX. Thus, the potential of the data bus line DBX is decreased from VCC. The transistor Q26 is OFF because the bit line BLX(LA) is at the low level. Hence, the potential of the data bus line DBZ is fixed to the high level.

Figure 25:
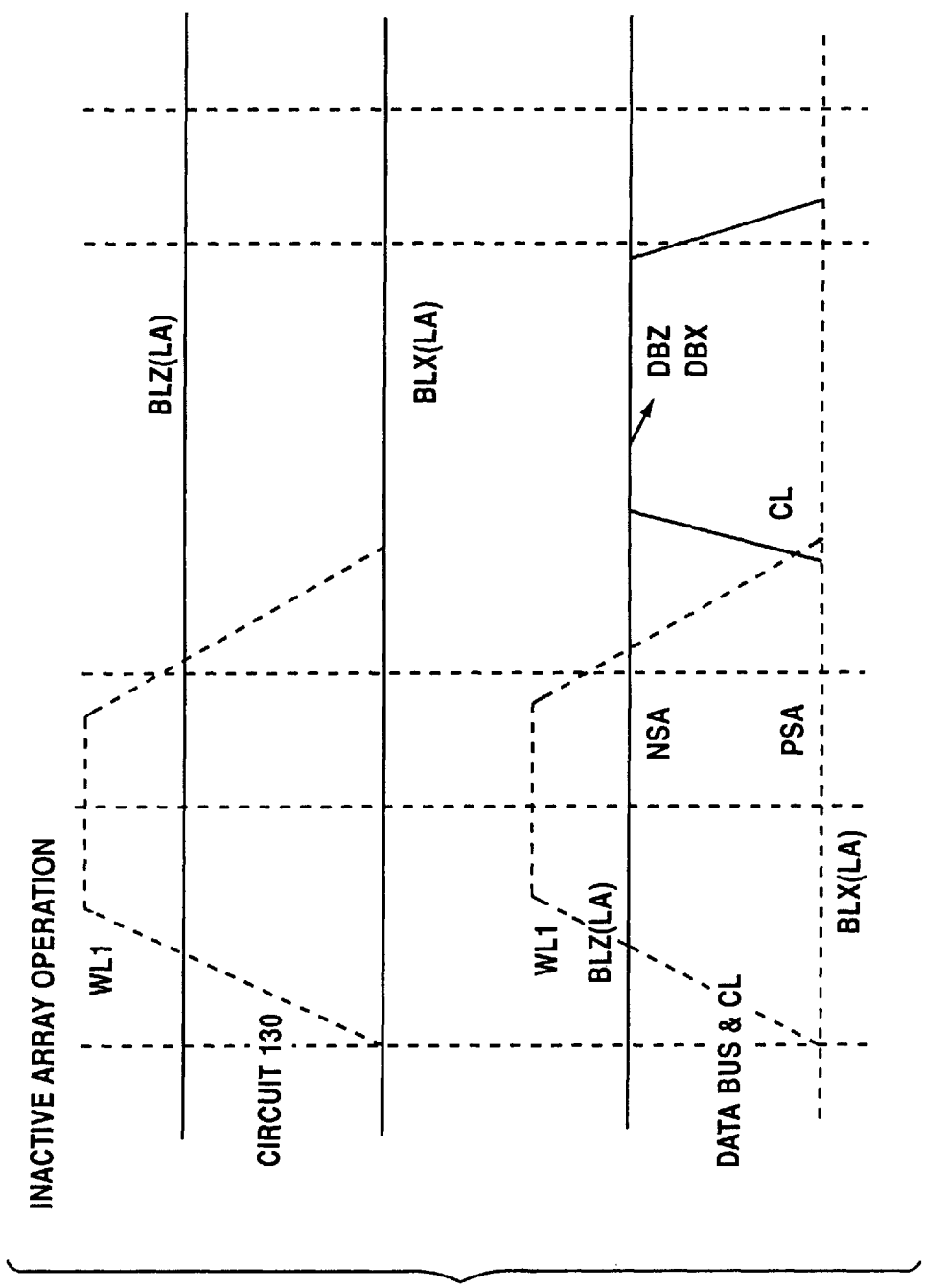
FIG. 25 is another waveform diagram of the operation of the circuit shown in FIG. 23.

FIG. 25 is a waveform diagram of an operation of the inactive array in the configuration shown in FIG. 23. In this case, the control signals NSA and PSA applied to the precharge circuit 130 are at the high and low levels, respectively. The transistor Q25 is ON and the transistor Q26 is OFF. Hence, even if the column select signal CL is turned ON and the transistors Q27 and Q28 are turned ON, the data bus lines DBX and DBZ and the node NSA of the precharge circuit 130 are at the same level (high level). Hence, the pass-through current does not flow.

In the configuration shown in FIG. 23, the sources of the transistors Q27 and Q28 are directly connected to the node NSA of the precharge circuit 130. Alternatively, the sources of the transistors Q27 and Q28 can be connected to a node the potential of which changes in the same manner as the potential of the node NSA.

In FIGS. 23 through 25, the data bus lines DBX and DBZ are precharged to VCC. When the data bus lines DBX and DBZ are precharged to VSS, the sources of the transistors Q27 and Q28 are connected to a node PSA of the precharge circuit 130. When the data bus lines DBX and DBZ are precharged to VCC/2, the sources of the transistors Q27 and Q28 are connected to a node (circuit) which has a potential of 0 V in the active array operation and a potential of VCC/2 in the inactive array operation.

Figure 26:
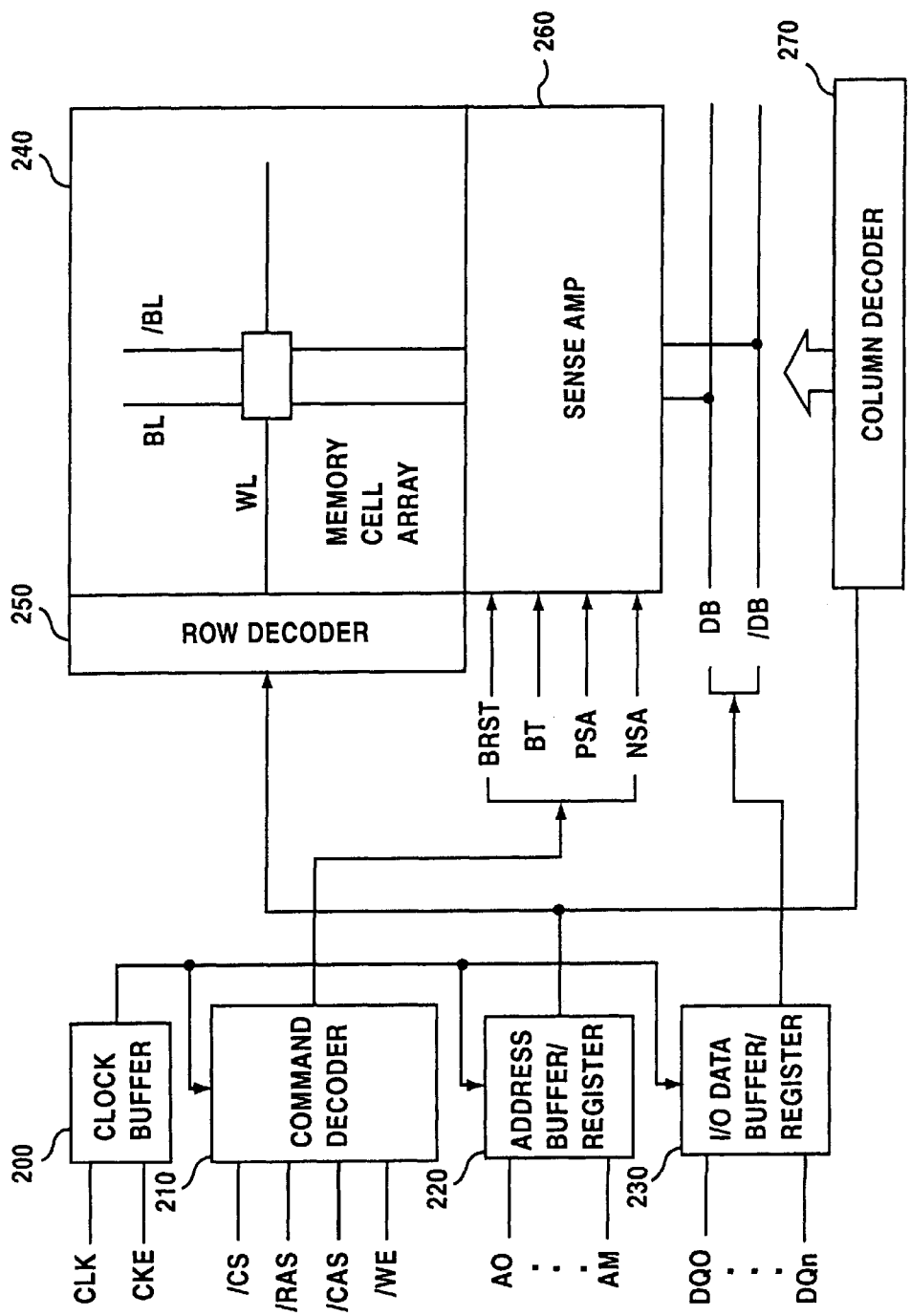
FIG. 26 is a block diagram of an overall structure of a semiconductor memory device of the present invention.

FIG. 26 is a block diagram of a synchronous DRAM (SDRAM) device to which any of the first through seventh embodiments of the present invention can be applied. As is well known, a SDRAM device is one of the DRAM devices and can operate in synchronism with a clock signal externally supplied thereto.

The SDRAM device shown in FIG. 26 includes a clock buffer 200, a command decoder 210, an address buffer/register 220, an I/O data buffer/register 230, a memory cell array 240, a row decoder 250, a sense amplifier part 260, and a column decoder 270. The clock buffer 200 externally receives a clock signal CLK and a clock enable signal CKE, and generates internal clock signals necessary to operate the internal circuits of the SDRAM device. The internal clock signals thus generated are supplied to, for example, the command decoder 210, the address buffer/register 220, and the I/O data buffer/register 230.

The command decoder 210 externally receives a chip select signal /CS, a row address strobe signal /RAS, a column address strobe signal /CAS and a write enable signal /WE, and generates, therefrom, various control signals necessary to operate the internal circuits. Examples of the control signals thus generated are the aforementioned bit line reset signal BRST, the transfer control signal BT and the control signals NSA and PSA. Although not shown in FIG. 26, the aforementioned control signal CNT and the gate control signal CLD are generated by the command decoder 210.

The address buffer/register 220 decodes address signals AO through Am externally supplied to the SDRAM device, and produces a row address signal and a column address signal therefrom. The I/O data buffer/register 230 is connected to data buses DB and /DB (which correspond to the aforementioned DBX and DBZ), and temporarily stores write data externally supplied and read data to be supplied to an external circuit.

The memory cell array 240 includes a large number of memory cells, word lines and bit lines. The row decoder 250 decodes the row address, and generates a signal which drives the selected word line. The column decoder 270 decodes the column address, and generates the aforementioned column select signal CL or the like. The sense amplifier part 260 includes all circuits between the memory cell array and the data buses DB and /DB. For example, when the circuit shown in FIG. 15 is applied to the SDRAM device shown in FIG. 26, the sense amplifier circuit 260 includes the sense amplifier 110, the precharge control circuit 1.70, the precharge circuit 130 and the data input/output circuit 140.

The arrangement relationship between the memory cell array 240 and the sense amplifier part 260 shown in FIG. 26 is directly related to the fourth embodiment of the present invention shown in FIG. 15. However, the arrangement shown in FIG. 26 is merely an example, and another arrangement between the memory cell array and the sense amplifier part can be employed. For example, the configuration shown in FIG. 18 is not directly related to the arrangement relationship between the memory cell array 240 and the sense amplifier part 260. However, it is possible to consider the configuration shown in FIG. 26 so that the configuration shown in FIG. 18 is realized in a block including the memory cell array 240 and the sense amplifier part 260 shown in FIG. 26. The memory cell array 240 can include a plurality of banks (cores).

The SDRAM device shown in FIG. 26 can be equipped with a unique function relating to the data write operation. Usually, data consisting of a plurality of bits is written into the SDRAM device at cine time. In this case, it is required to mask some bits of the write data and hence prevent the bits to be masked from being written into the SDRAM device. For example, when write data on the data buses is written into the memory cell array via the sense amplifier part, some bits of the write data are masked.

Figure 27:
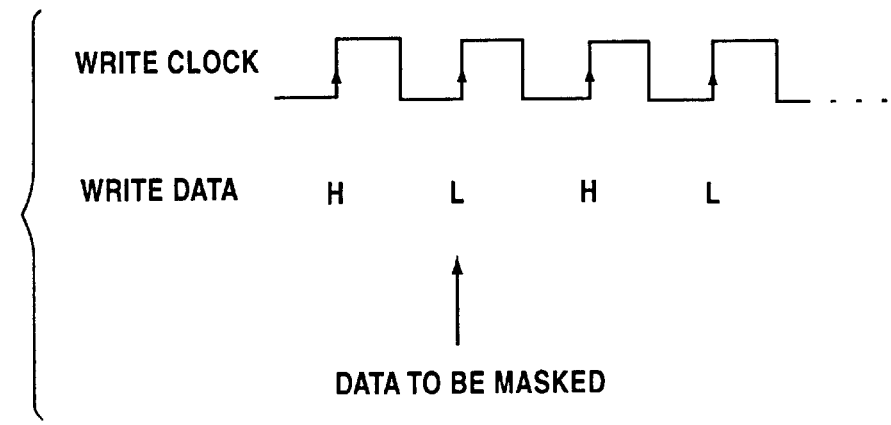
FIG. 27 is a timing chart of a write operation which can be executed in the device shown in FIG. 26.

FIG. 27 explains a write operation on a one-bit data bus line and a mask operation. Data H, L, H, L, . . . is sequentially written into memory cells in synchronism with the rising edges of a write clock. If it is required to inhibit the second data L from being written into a memory cell, the second data L is masked at that timing so that the second data L is prevented from being output to the data bus line corresponding to the above memory cell. In order to realize the above mask operation, a mask signal is generated.

Another data write operation is known in which a plurality of items of one-bit data appearing on a data bus line at different times are serially stored and are then written into memory cells at one time by sense amplifiers which are simultaneously selected. In the example shown in FIG. 27, the write operation is not carried out until four bits H, L, H and L are obtained. When the four bits are obtained, the write operation is carried out and the four bits are written into the selected memory cells at one time. In this case, if the second bit should be masked, it is necessary to specify that the second data should be masked in order to enable the other data to be written into the corresponding memory cells at one time. However, the mask operation shown in FIG. 27 cannot realize the above write operation, because one bit is written in synchronism with the rising edge of the write clock and a decision as to whether the one-bit data should be masked is made in synchronism with the rising edge thereof.

Figure 28:
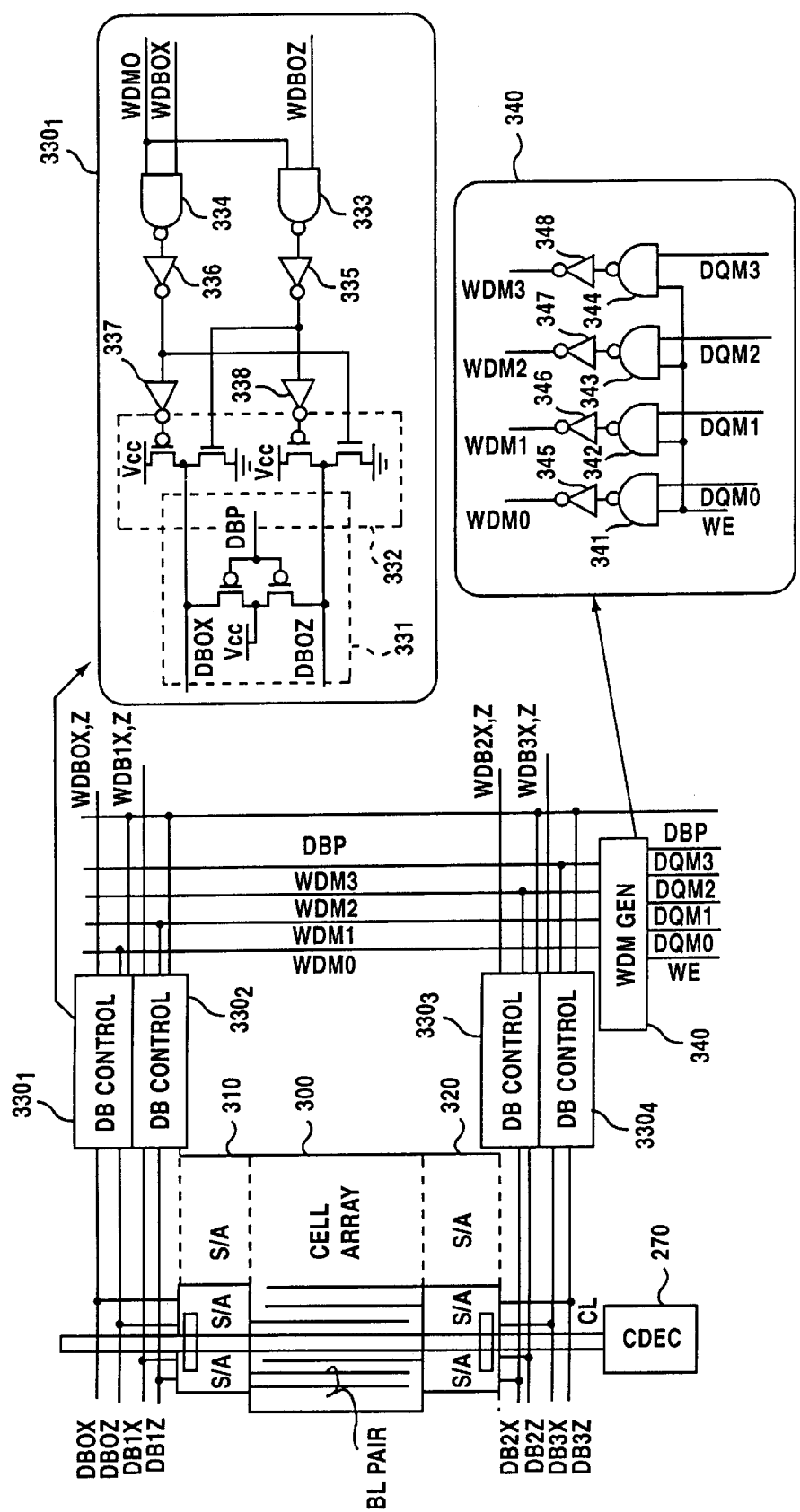
FIG. 28 is a circuit diagram of a semiconductor memory device according to an eighth embodiment of the present invention.

A configuration shown in FIG. 28 is directed to enabling the mask operation under the situation that a plurality of data bits is to be stored and written at one time. This can be realized by setting each data bus line corresponding to respective data to be masked to a floating state. Hence, data to be masked can be specified and inhibited from being written into the corresponding memory cell.

The configuration shown in FIG. 28 corresponds to the cell array 240 and the sense amplifier 260 shown in FIG. 26, and enables four data bits to be written at one time. A plurality of sense amplifiers 310 and 320 are arranged on respective sides of a cell array 300. Bit lines alternately extend from the sense amplifiers 310 and 320 in the formation shown in FIG. 14B. In FIG. 28, a pair of but lines is illustrated so as to extend from each of the sense amplifiers 310 and 320. Further, the sense amplifiers 310 and 320 are connected to data buses. In FIG. 28, the sense amplifiers 310 and 320 are connected to four pairs of data buses DB0X, DB0Z; DE1X, DB1Z; DB2X, DB2Z; DB3X, DB3Z. A column decoder 270 selects four data input/output circuits (which correspond to the aforementioned data input/output circuit 140 but are not shown in FIG. 28 for the sake of simplicity) when data is written into the cell array 300. Hence, the four sense amplifiers are connected to the above data bus lines.

Data bus control circuits 3301, 3302, 3303 and 3304 are provided to the respective pairs of data buses DB0X, DB0Z; DB1X, DB1Z; DB2X, DB2Z; DB3X, DB3Z. The data bus control circuits 3301, 3302, 3303 and 3304 are connected to write indication signal lines WDM0, WDM1, WDM2 and WDM3, data bus lines WDB0X, WDB0Z, WDB1X, WDB1Z, WDB2X, WDB2Z, WDB3X and WDB3Z, and a data bus precharge indication signal line DBP, as shown in FIG. 28. A write indication signal generator 340 generates write indication signals WDM0, VIDM1, WDM2 and WDM3 by performing a predetermined operation on the write enable signal WE, and data mask signals DQM0, DQM1, DQM2 and DQM3.

The data mask signals DQM0, DQM1, DQM2 and DQM3 and the data bus precharge signal DBP are supplied from the command decoder 210 shown in FIG. 26. The data bus lines WDB0X, WDB0Z, WDB1X, WDB1Z, WDB2X, WDB2Z, WDB3X and WDB3Z are connected to the I/O data buffer/register 230 shown in FIG. 26.

The write indication signal generator 340 includes four NAND gates 341–344, and four inverters 345–348. The NAND gates 341–344 perform respective NAND operations on the write enable signal WE and the data mask signals DQM0, DQM1, DQM2 and DQM3. The output signals of the NAND gates 341–344 are applied to the inverters 345–348. The inverted versions of the output signals of the NAND gates 341–344 serve as the write indication signals WDM0, WDM1, WDM2 and WDM3. The data mask signals DQM0, DQM1, DQM2 and DQM3 are low when the corresponding data bits should be masked.

Each of the data bus control circuits 3301 3304 includes a precharge circuit 331, a data bus drive circuit 332, NAND gates 333 and 334, and inverters 335–338. In FIG. 28, the above structure of only the data bus circuit $33_0$, is shown. The NAND gate 334 performs a NAND operation on the write instruction signal WDM0 and the write data WDB0X, and the output signal thereof is applied, via the inverters 336 and 337, to the gate of a P-channel MOS transistor of a CMOS inverter located on the DB0X side of the data bus drive circuit 332. The output signal of the inverter 336 is applied to the gate of an N-channel MOS transistor of a CMOS inverter located on the DB0Z side of the data bus drive circuit 332. The NAND gate 333 performs a NAND operation on the write indication signal WDM0 and the write data WDB0Z, and the output signal thereof is applied, via the inverters 335 and 338, to the gate of P-channel MOS transistor of the CMOS inverter located on the DB0Z side of the data bus drive circuit 332. The output signal of the inverter 335 is applied to the gate of an N-channel MOS transistor of the CMOS inverter located on the DB0X side of the data bus drive circuit 332. The outputs of the above two CMOS inverters are respectively connected to the data bus lines DB0X and DB0Z.

When all of the four transistors of the data bus drive circuit 332 are turned OFF, the data bus lines DB0X and DB0Z are set to the floating state.

The precharge circuit 332 includes two P-channel MOS transistors 331. The gates of the two transistors 331 receive the above data bus precharge indication signal, and the drains thereof are connected to the data bus lines DB0X and DB0Z. In the configuration shown in FIG. 28, the data bus lines DB0X and DB0Z are precharged to VCC.

Figure 29:
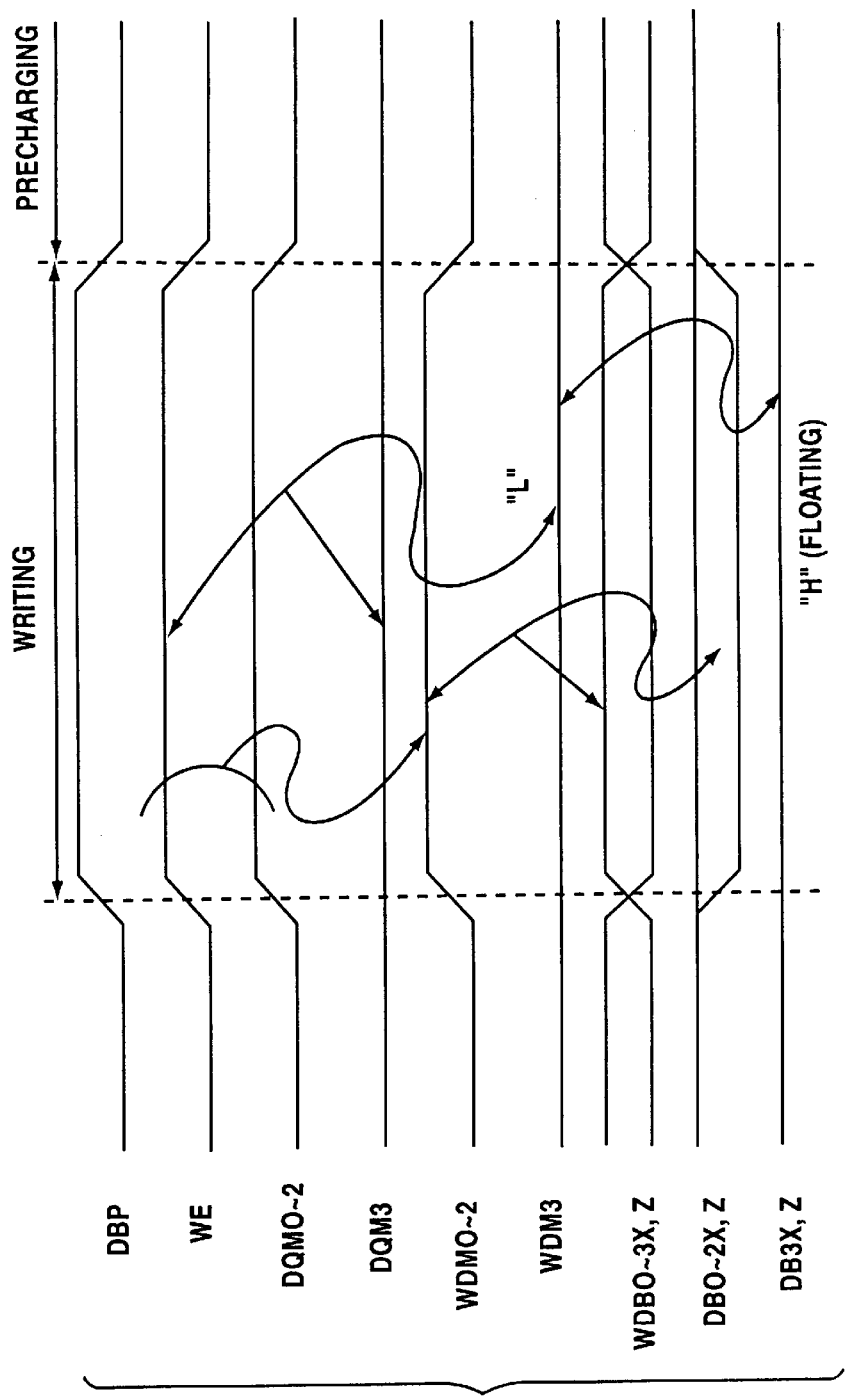
FIG. 29 is a waveform diagram of an operation of the circuit shown in FIG. 28.

FIG. 29 is a timing chart of an operation of the configuration shown in FIG. 28.

In a data write operation in which four sense amplifiers can be simultaneously selected, the data bus precharge signal DBP and the write enable signal WE rise, so that the write operation is enabled. In the example shown in FIG. 29, the data mask signals DQM0–DQM2 rise, and the write operation on the corresponding data is indicated. The data mask signal DQM3 is maintained at the low level, and the mask operation on the corresponding data should be indicated. In this case, the write indication signal generating circuit 340 sets the write indication signals WDM0, WDM1 and WDM2 to the high level, and sets the write indication signal WDM3 to the low level.

In response to the write indication signal WDM3, all of the four transistors of the data bus drive circuit 332 of the data bus control circuit $330_4$ are turned OFF. Since the write indication signal WDM3 is low, the output signals of the inverters 335 and 336 are low, and the output signals of the inverters 337 and 338 are high. Hence, the data bus lines DB3X and DB3Z are set to the high-level floating state. This high-level floating state corresponds to the aforementioned data reading state of the sense amplifier. Hence data cannot be written into the memory cell array.

The other data bus control circuits $330_1$–$330_3$ drive the data bus lines DB0X–DB2Z in accordance with the write data WDB0X, WDB0Z, WDB1X, WDB1Z, WDB2X and WDB2Z.

As described above, one or some data bits among data bits to be written at one time can be masked and inhibited from being written by setting the corresponding data bus line or lines to the floating state.

The present invention includes all types of DRAM devices.

The present invention is not limited to the specifically disclosed embodiments, and variations and modifications may be made without departing from the scope of the present invention.

What is claimed is:

1. A semiconductor memory device comprising:
    memory cells;
    word lines connected to the memory cells;
    bit lines connected to the memory cells; and
    a first circuit which resets the bit lines to a reset potential for the next read cycle depending on data read to the bit lines in a previous read cycle.

2. The semiconductor memory device as claimed in claim 1, wherein:
    said bit lines include a pair of bit lines; and
    said first circuit resets one of the pair of bit lines to the reset potential which is equal to a potential of the other one of the pair of bit lines which was connected to a selected one of the memory cells.

3. The semiconductor memory device as claimed in claim 1, wherein said reset potential is equal to one of a high-potential-side power supply voltage and a low-potential-side power supply voltage.

4. The semiconductor memory device as claimed in claim 2, further comprising:
    a dummy cell circuit selectively connected to one of the pair of bit lines,
    wherein said dummy cell circuit sets one of the pair of bit lines to a potential different from a potential of the other one of the pair of bit lines which was connected to the selected one of the memory cells.

5. The semiconductor memory device as claimed in claim 2, wherein one of the pair of bit lines is driven in each read cycle.

6. The semiconductor memory device as claimed in claim 1, wherein a read cycle following said previous read cycle is initiated before a data output operation from a selected one of the memory cells output to an external device corresponding to the previous read cycle is finished.

7. The semiconductor memory device as claimed in claim 1, further comprising sense amplifiers connected to the bit lines, an input potential of the sense amplifiers being reset based on the data read in the previous read cycle.

8. The semiconductor memory device as claimed in claim 7, wherein:
    the sense amplifiers include first and second sense amplifiers which are respectively arranged on both sides of the bit lines; and
    when the first sense amplifiers located on one side of the bit lines is activated, the second sense amplifiers located on the other side of the bit lines is non-activated.

9. The semiconductor memory device as claimed in claim 7, further comprising a second circuit which resets the input potential of the sense amplifiers on the basis of the data read in the previous read cycle.

10. The semiconductor memory device as claimed in claim 1, further comprising:
    first sense amplifiers connected to the bit lines;
    second sense amplifiers connected to another bit lines and
    wherein the first circuit which is provided in common to the first and second sense amplifiers and is located therebetween.

11. The semiconductor memory device as claimed in claim 10, wherein the first circuit resets input potentials the first and second sense amplifiers to different reset levels.

12. The semiconductor memory device as claimed in claim 1, further comprising:
    sense amplifiers connected to the bit lines;
    data input/output circuits which are provided between the sense amplifiers and data buses and are controlled by column select signals; and
    gate circuits which are provided between the sense amplifiers and the data buses and selectively connect the sense amplifiers to the data buses on the basis of states of sense amplifiers.

13. The semiconductor memory device as claimed in claim 12, wherein each of the data input/output circuits is a direct sense circuit which includes a transistor which indirectly couples the corresponding bit lines to the data buses, said transistor providing the data buses with a given potential on the basis of an output level of the corresponding sense amplifier.

14. The semiconductor memory device as claimed in claim 13, wherein the given potential is a reset potential of the data buses when the sense amplifiers are OFF.

15. A semiconductor memory device comprising:
    memory cells;
    word lines connected to the memory cells;
    pairs of bit lines connected to the memory cells;
    sense amplifiers connected to the pairs of bit lines;
    pairs of data buses coupled the sense amplifiers via data input/output circuits; and
    a circuit which sets the pairs of data buses to a floating state,
    wherein, when data includes a bit to be masked and inhibited from being written into a corresponding one of the memory cells, said circuit sets a corresponding one of the pairs of data buses to the floating state.

16. The semiconductor memory device as claimed in claim 1, wherein data on the bit lines read from a selected one of the memory cells is output, while the first circuit resets the bit lines.

17. The semiconductor memory device as claimed in claim 2, wherein:

the first circuit includes sense amplifiers each connected to a corresponding pair of bit lines; and the sense amplifiers provide both of the pair of bit lines with the reset potential.

18. The semiconductor memory device as claimed in claim 17, further comprising a pair of transfer gate transistors disposed between the pair of bit lines and a pair of input/output nodes of the sense amplifiers, wherein either one of the pair of transfer gate transistors turns on while the sense amplifiers provide the reset potential.

19. The semiconductor memory device as claimed in claim 4, wherein the dummy cell circuit comprises:

a dummy capacitor having a node connected to a low-potential-side power supply voltage, and an opposite node;

a first dummy cell transistor and a second dummy cell transistor connected between the pair of bit lines, for selectively coupling the opposite node of the dummy capacitor to one of the pair of bit lines; and a precharge transistor connected to the opposite node of the dummy capacitor for providing the opposite node with a precharge potential.

20. The semiconductor memory device as claimed in claim 1, wherein:

the bit lines include a first pair of bit lines and a second pair of bit lines;

the first circuit includes a sense amplifier selectively coupled to one of the first pair of bit lines and the second pair of bit lines; and the sense amplifier is disposed between the first pair of bit lines and the second pair of bit lines.

21. The semiconductor memory device as claimed in claim 2, further comprising:

sense amplifiers each connected to a corresponding pair of bit lines;

a pair of transfer gate transistors disposed between the sense amplifier and the first circuit; and a reset transistor selectively connecting both of the pair of bit lines mutually, and the reset transistor disposed between the pair of transfer gate transistors and the sense amplifier.

22. The semiconductor memory device as claimed in claim 21, wherein each of the pair of transfer gate transistors is controlled independently.

23. The semiconductor memory device as claimed in claim 21, wherein both of the sense amplifiers and the first circuit are disposed on one side of the bit lines.

24. A semiconductor memory circuit comprising:

a memory cell;

a word line connected to the memory cell;

a pair of bit lines connected to the memory cell; and a first circuit which resets the pair of bit lines to a reset potential for a second read cycle depending on data read to the pair of bit lines in a first read cycle, the first read cycle preceding the second read cycle.

* * * * *